United States Patent
Maeda

(10) Patent No.: US 8,358,539 B2
(45) Date of Patent: Jan. 22, 2013

(54) NON-VOLATILE SEMICONDUCTOR STORAGE DEVICE

(75) Inventor: Takashi Maeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/439,213

(22) Filed: Apr. 4, 2012

(65) Prior Publication Data

US 2012/0187466 A1 Jul. 26, 2012

Related U.S. Application Data

(63) Continuation of application No. 12/727,827, filed on Mar. 19, 2010, now Pat. No. 8,164,956.

(30) Foreign Application Priority Data

Sep. 14, 2009 (JP) ................................. 2009-212330

(51) Int. Cl.
*G11C 16/04* (2006.01)
(52) U.S. Cl. .............................. 365/185.17; 365/185.05
(58) Field of Classification Search ............. 365/185.17, 365/185.05
See application file for complete search history.

(56) References Cited

U.S. PATENT DOCUMENTS

| | | | |
|---|---|---|---|
| 5,680,347 A | 10/1997 | Takeuchi et al. | |
| 7,736,973 B2 | 6/2010 | Orimoto et al. | |
| 7,910,973 B2 | 3/2011 | Sakaguchi et al. | |
| 8,008,710 B2 | 8/2011 | Fukuzumi et al. | |
| 8,089,114 B2 | 1/2012 | Kim et al. | |
| 8,107,286 B2* | 1/2012 | Itagaki et al. | 365/185.02 |
| 8,169,826 B2* | 5/2012 | Hishida et al. | 365/185.11 |
| 2007/0252201 A1 | 11/2007 | Kito et al. | |
| 2010/0002516 A1 | 1/2010 | Sim et al. | |
| 2010/0038703 A1* | 2/2010 | Fukuzumi et al. | 257/326 |
| 2011/0013454 A1* | 1/2011 | Hishida et al. | 365/185.11 |
| 2011/0069552 A1* | 3/2011 | Itagaki et al. | 365/185.18 |
| 2011/0108907 A1* | 5/2011 | Maeda | 257/324 |
| 2011/0235421 A1* | 9/2011 | Itagaki et al. | 365/185.17 |
| 2011/0266607 A1 | 11/2011 | Sim et al. | |
| 2011/0287597 A1 | 11/2011 | Kito et al. | |
| 2011/0309432 A1* | 12/2011 | Ishihara et al. | 257/324 |

(Continued)

FOREIGN PATENT DOCUMENTS

JP 2007-266143 10/2007

(Continued)

OTHER PUBLICATIONS

Japanese Office Action issued on Dec. 20, 2011, in Japanese Patent Application No. 2009-212330 filed Sep. 14, 2009 (with English Translation).
H. Tanaka et al., "Bit Cost Scalable Technology with Punch and Plug Process for Ultra High Density Flash Memory", Symposium on VLSI Technology Digest of Technical Papers, 2007, pp. 14-15.

(Continued)

*Primary Examiner* — Tuan T. Nguyen
(74) *Attorney, Agent, or Firm* — Oblon, Spivak, McClelland, Maier & Neustadt, L.L.P.

(57) ABSTRACT

At least some of the memory transistors included in a first memory string are commonly connected to first conductive layers that are connected to at least some of the memory transistors included in a second memory string connected to the same third and fourth conductive layers as the first memory string. At least one of either the memory transistors or the back-gate transistor in the first memory string and at least one of either the memory transistors or the back-gate transistor in the second memory string are connected to the independent first or fifth conductive layers, respectively.

9 Claims, 23 Drawing Sheets

U.S. PATENT DOCUMENTS

2012/0008400 A1* 1/2012 Fukuzumi et al. ....... 365/185.18
2012/0069655 A1* 3/2012 Hishida et al. ........... 365/185.05
2012/0069662 A1* 3/2012 Sakurai et al. ........... 365/185.11

FOREIGN PATENT DOCUMENTS

| | | |
|---|---|---|
| JP | 2009-146954 | 7/2009 |
| JP | 2009-158529 | 7/2009 |
| JP | 2010-118659 | 5/2010 |
| JP | 2011-9409 | 1/2011 |
| WO | WO 2009/075370 A1 | 6/2009 |

OTHER PUBLICATIONS

Yoshiaki Fukuzumi, et al., "Optimal Integration and Characteristics of Vertical Array Devices for Ultra-High Density, Bit-Cost Scalable Flash Memory", IEDM Technical Disges, 2007, pp. 449-452.

Yosuke Komori, et al., "Disturbless Flash Memory due to High Boost Efficiency on BICS Structure and Optimal Memory Film Stack for Ultra High Density Storage Device", IEDM Technical Diges, 2008, pp. 851-854.

* cited by examiner

Enlarged View of Part A

NON-VOLATILE SEMICONDUCTOR STORAGE DEVICE

CROSS REFERENCE TO RELATED APPLICATIONS

This application is a continuation of U.S. application Ser. No. 12/727,827 filed Mar. 19, 2010, and is based on and claims the benefit of priority from prior Japanese Patent Application No. 2009-212330, filed on Sep. 14, 2009, the entire contents of each of which are incorporated herein by reference.

BACKGROUND OF THE INVENTION

1. Field of the Invention

The present invention relates to an electrically rewritable non-volatile semiconductor storage device.

2. Description of the Related Art

Conventionally, LSIs are formed by integration of devices in a two-dimensional plane on the silicon substrate. Although the dimension for each device is commonly reduced (refined) to increase memory storage capacity, recent years are facing challenges in such refinement from the viewpoint of cost and technology. Such refinement requires further improvements in photolithography technology. However, the costs of lithography process are ever increasing. In addition, if such refinement is accomplished, it is assumed that physical improvement limit, such as in breakdown voltage between devices, would be reached unless driving voltage can be scaled. That is, it is likely that difficulties would be encountered in device operation itself.

Therefore, such semiconductor storage devices have been proposed recently where memory cells are arranged in a three-dimensional manner to achieve improved integration of memory devices.

One of the conventional semiconductor storage devices where memory cells are arranged in a three-dimensional manner uses transistors with a cylinder-type structure (see, for example, Japanese Patent Laid-Open No 2007-266143). Those semiconductor storage devices using transistors with the cylinder-type structure are provided with multiple conductive layers corresponding to gate electrodes and pillar-like columnar semiconductors. Each columnar semiconductor serves as a channel (body) part of a respective transistor. Memory gate insulation layers are provided around the columnar semiconductors. Such a configuration including these conductive layers, columnar semiconductors, and memory gate insulation layers is referred to as a "memory string".

In these conventional semiconductor storage devices with three-dimensional structures, those memory strings to be read at the same time have one ends connected to respective bit lines and the other ends connected to a common source line. This configuration has a problem that changes in the potential (potential floating) of the source line due to read current become larger and the read current becomes smaller as more memory cells are integrated and more memory strings are to be read at the same time, which results in a longer reading time. This configuration is also problematic in providing a sufficient read margin because the amount of potential floating of the source line varies depending on the position in the memory cell array, causing variations in read current.

SUMMARY OF THE INVENTION

One aspect of the present invention provides a semiconductor storage device comprising: a memory cell array having a plurality of memory strings arranged therein, each of the memory strings including a plurality of electrically rewritable memory transistors and selection transistors operative to select a memory transistor, each of the plurality of memory strings comprising: a body semiconductor layer having first and second columnar portions extending in a vertical direction to a substrate, and a joining portion formed to join the lower ends of the first and second columnar portions; an electric charge storage layer formed to surround a side surface of a respective one of the columnar portions; a first conductive layer formed to surround a side surface of a respective one of the columnar portions as well as the electric charge storage layer, and functioning as a word line connected to a control electrode of a respective one of the memory transistors; a second conductive layer formed on a side surface of a respective one of the columnar portions via an insulation film, and functioning as a selection gate line connected to a control electrode of a respective one of the selection transistors; a third conductive layer arranged with a first direction taken as its longitudinal direction, connected to one end of a respective one of the memory strings, and functioning as a bit line; a fourth conductive layer arranged with the first direction taken as its longitudinal direction so as to be inserted between a plurality of the third conductive layers, connected to the other end of a respective one of the memory strings, and functioning as a source line; and a fifth conductive layer formed on a side surface of the joining portion via an insulation film, and functioning as a control electrode of a back-gate transistor, the back-gate transistor being one of the selection transistors that is formed at one of the joining portions, at least some of the memory transistors included in a first memory string being commonly connected to the first conductive layers connected to at least some of the memory transistors included in a second memory string, the first memory string being one of the memory strings that is connected to adjacent ones of the third and fourth conductive layers, the second memory string being another one of the memory strings that is connected to the same third and fourth conductive layers that the first memory string is connected to, at least one of the memory transistors or the back-gate transistor in the first memory string and at least one of the memory transistors or the back-gate transistor in the second memory string being connected to the independent first or fifth conductive layers, respectively.

In addition, another aspect of the present invention provides a semiconductor storage device comprising: a memory cell array having a plurality of memory strings arranged therein, each of the memory strings including a plurality of electrically rewritable memory transistors and selection transistors operative to select the memory transistors, each of the plurality of memory strings comprising: a body semiconductor layer having a columnar portion extending in a vertical direction to a substrate; an electric charge storage layer formed to surround a side surface of a respective one of the columnar portions; a first conductive layer formed to surround a side surface of the columnar portion as well as the electric charge storage layer, and functioning as a word line connected to a control electrode of a respective one of the memory transistors; a second conductive layer formed on a side surface of the columnar portion via an insulation film, and functioning as a selection gate line connected to a control electrode of a respective one of the selection transistors; a third conductive layer arranged with a first direction taken as its longitudinal direction, connected to one end of a respective one of the memory strings, and functioning as a bit line; and a fourth conductive layer arranged with the first direction taken as its longitudinal direction, connected to the other end of a respective one of the memory strings, and functioning as a source line, the memory transistors included in a first memory string being commonly connected to the first conductive layers connected to the memory transistors included in a second memory string, the first memory string being one of the memory strings that is connected to a pair of the third conductive layer and the fourth conductive layer, the second memory string being another one of the memory strings that is connected to the same third and fourth conductive layers and adjacent to the first memory string, the selection transistors in the first memory string and the selection transistors in the second memory string being connected to the independent second conductive layers, respectively.

Still another aspect of the present invention provides a semiconductor storage device comprising: a memory cell array having a plurality of memory strings arranged therein, each of the memory strings including a plurality of electrically rewritable memory transistors and selection transistors operative to select the memory transistors; a word line connected to a control gate of a respective one of the memory transistors; a bit line connected to one end of a respective one of the memory strings; and a source line connected to the other end of a respective one of the memory strings, at least some of the memory transistors included in a first memory string being commonly connected to the word lines connected to at least some of the memory transistors included in a second memory string, the first memory string being one of the memory strings that is connected to one of the bit lines and one of the source lines, the second memory string being another one of the memory strings that is adjacent to the first memory string and connected to the same bit line and source line, at least one of the transistors in the first memory string and at least one of the transistors in the second memory string being configured to be controlled in its conduction independently of each other.

DETAILED DESCRIPTION OF THE EMBODIMENTS

Figure 1:
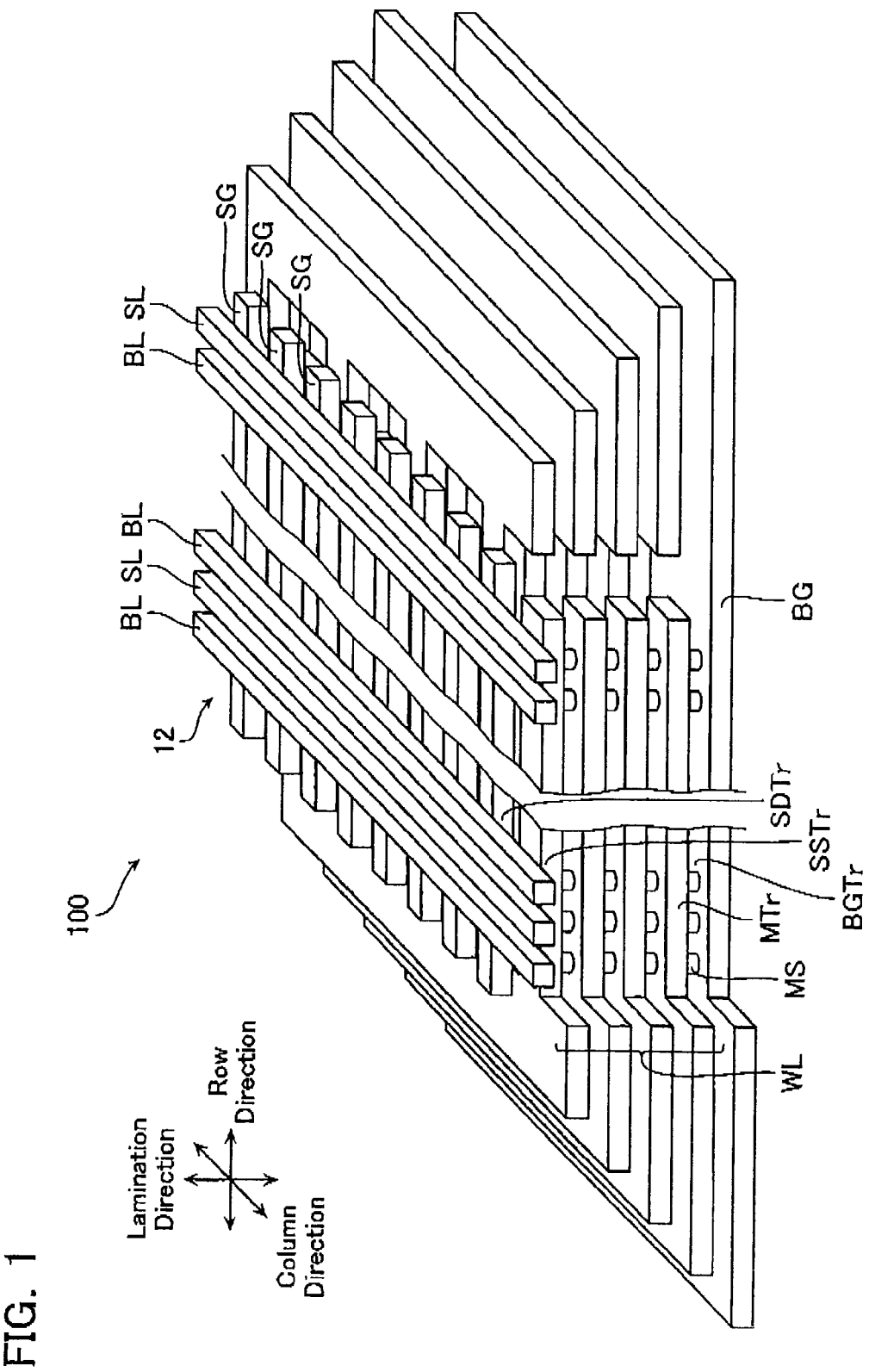
FIG. 1 is a schematic configuration diagram of a non-volatile semiconductor storage device 100 according to a first embodiment of the present invention.

Embodiments of the present invention will now be described in detail below with reference to the accompanying drawings.

Referring now to the drawings, a non-volatile semiconductor storage device according to embodiments of the present invention will be described.

First Embodiment

At first, a first embodiment of the present invention will be described in detail below with reference to the drawings, such as FIG. 1. FIG. 1 schematically illustrates anon-volatile semiconductor storage device 100 according to the first embodiment of the present invention.

The non-volatile semiconductor storage device 100 comprises a memory cell array 12 that has memory transistors for storing data arranged in a three-dimensional manner. The memory cell array 12 includes memory strings MS arranged in a matrix form. Each memory string MS has a plurality of memory transistors MTr and a back-gate transistor BGTr connected in series in U-shape in a lamination direction, as well as a drain-side selection transistor SDTr and a source-side selection transistor SSTr connected to each end. As described below, the memory transistors MTr are MONOS-type transistors. The memory transistors MTr, which are formed to be aligned in the lamination direction, have their control gate electrodes connected to the word lines WL that are laminated in the lamination direction with interlayer insulation films (not illustrated) sandwiched therebetween.

In addition, each drain-side selection transistor SDTr and each source-side selection transistor SSTr have their gate electrodes connected to respective selection gate lines SG. The selection gate lines SG are formed with a row direction (second direction) taken as their longitudinal direction, and arranged at a certain pitch in a column direction (first direction). Additionally, in this embodiment, both bit lines BL and source lines. SL are formed in parallel to each other with the column direction (first direction) taken as their longitudinal direction. The bit lines BL and the source lines SL are arranged to alternate with one another in the row direction.

Figure 2:
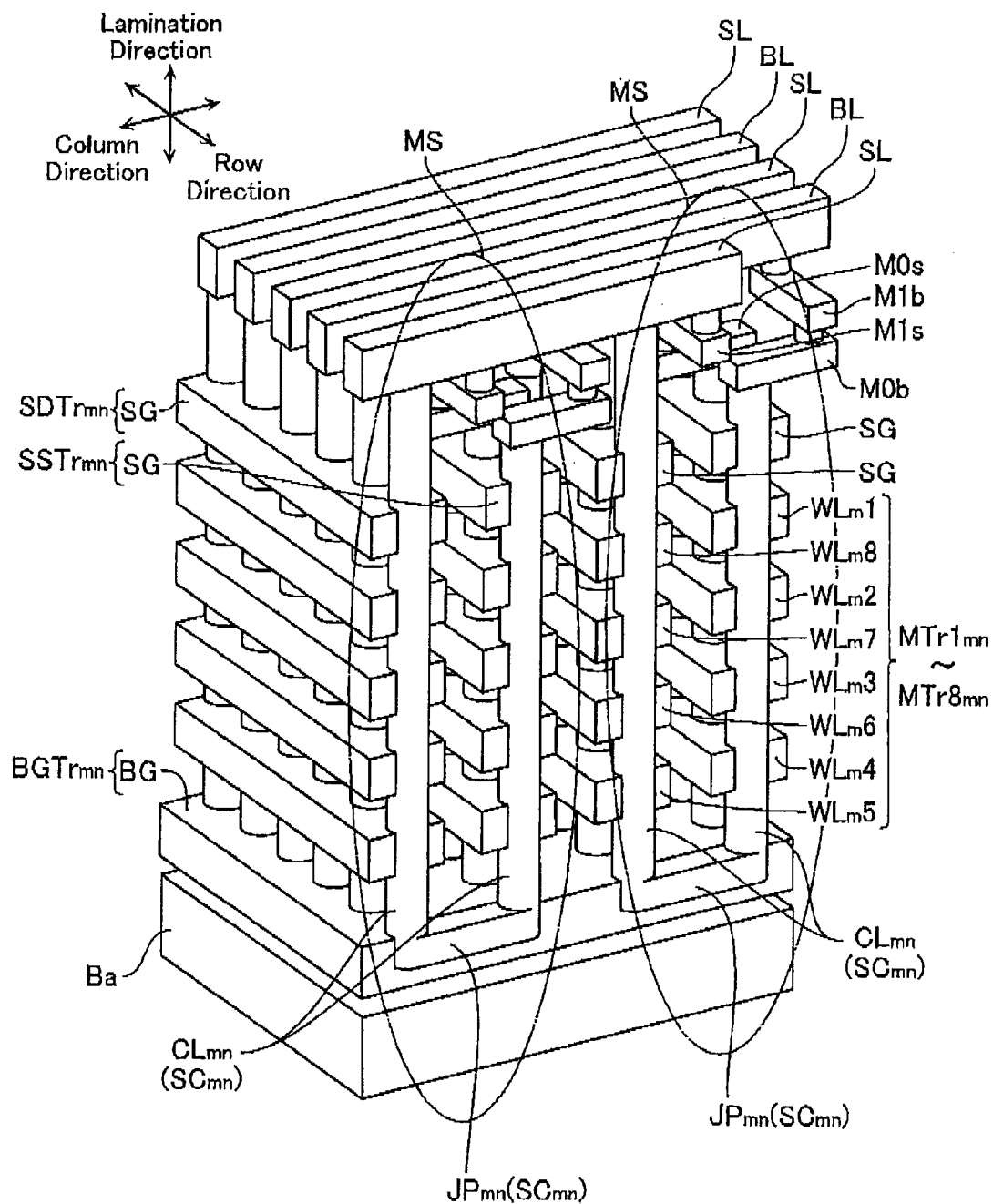
FIG. 2 is a schematic perspective view illustrating a part of one memory cell array 12 according to the first embodiment of the present invention.
Figure 3:
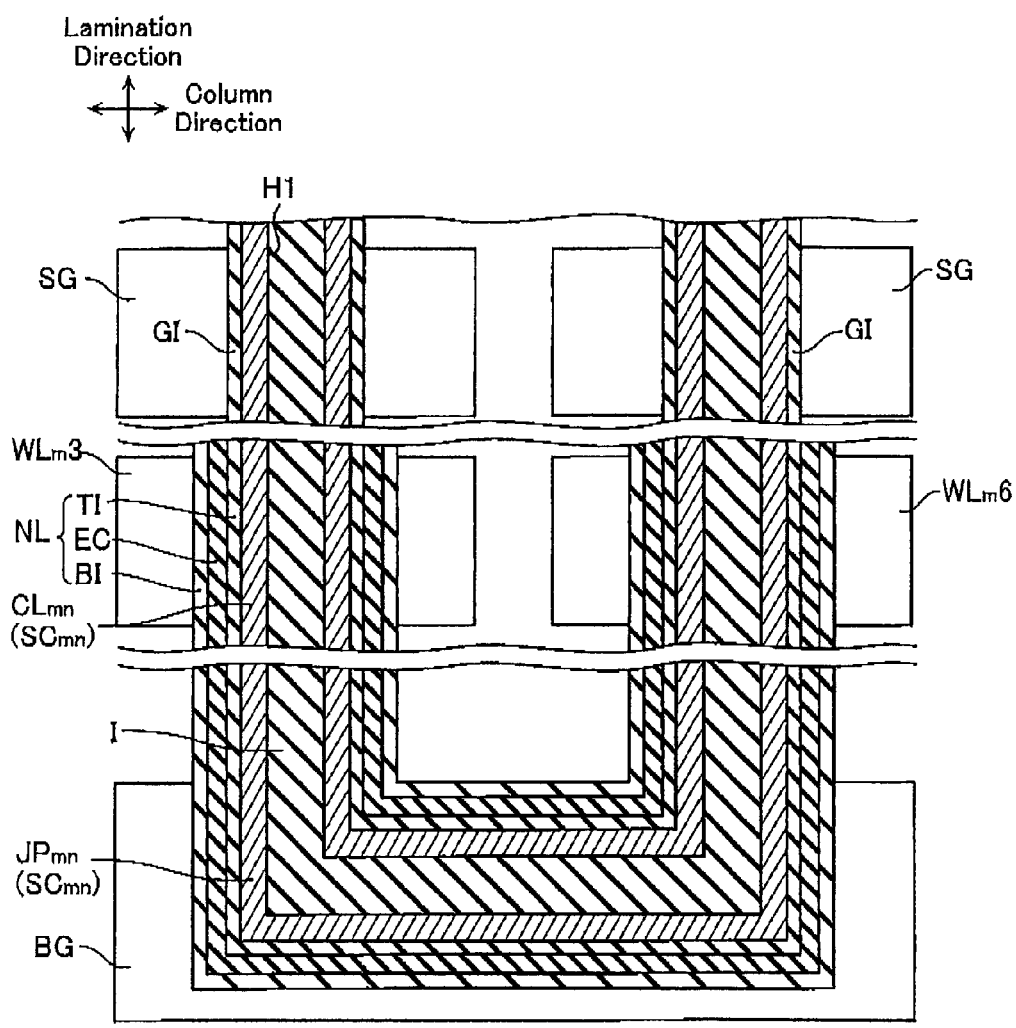
FIG. 3 is an enlarged cross-sectional view of a part of one memory string MS which is a unit of memory transistors.
Figure 4:
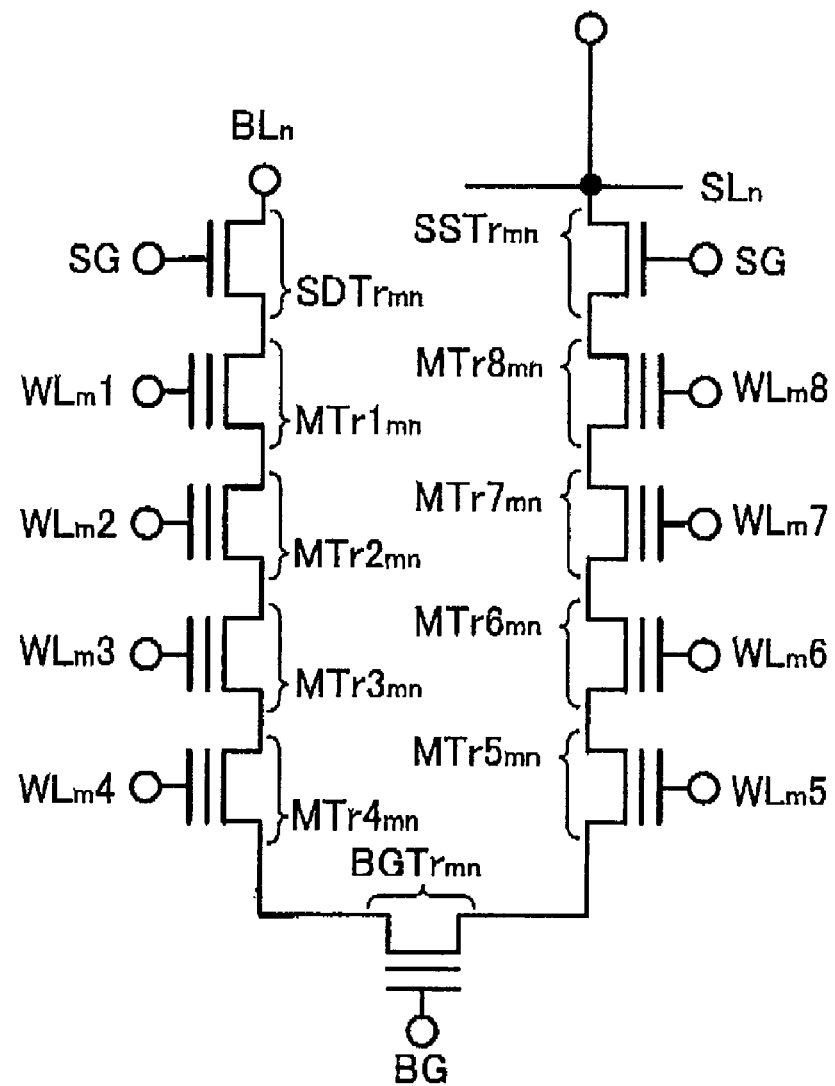
FIG. 4 is an equivalent circuit diagram of one memory string MS.

FIG. 2 is a schematic perspective view illustrating a part of one memory cell array 12 in the non-volatile semiconductor storage device 100 according to the first embodiment. FIG. 3 is an enlarged cross-sectional view of a part of one memory string MS which is a unit of memory transistors. FIG. 4 is an equivalent circuit diagram of one memory string MS.

As illustrated in FIG. 2, the memory cell array 12 has m×n (where m and n are natural numbers) memory strings $MS_{mn}$ arranged in a matrix form in a planar direction. Formed in one memory string $MS_{mn}$ are eight electrically rewritable memory transistors $MTr1_{mn}$ to $Mtr8_{mn}$, a source-side selection transistor $SSTr_{mn}$, a drain-side selection transistor $SDTr_{mn}$, and a back-gate transistor $BGTr_{mn}$, as illustrated in FIG. 4. Hereinafter, these transistors or the like may be collectively referred to simply as, without labels m and n, "memory string MS", "memory transistor MTr", "source-side selection transistor SSTr", "drain-side selection transistor SDTr", and "back-gate transistor BGTr".

As illustrated in FIG. 2, one memory string $MS_{mn}$ has two columnar portions $CL_{mn}$ that extend in a vertical direction to a semiconductor substrate Ba and that are arranged to be aligned in the column direction, as well as a joining portion $JP_{mn}$ that extends to join the lower ends of these columnar portions $CL_{mn}$, with the column direction taken as its longitudinal direction. The columnar portions $CL_{mn}$ and the joining portion $JP_{mn}$ are included in a body semiconductor layer $SC_{mn}$ as the channel region (body) of the memory transistors and the selection transistors. That is, each memory string $MS_{mn}$ of this embodiment has a so-called U-shape. Four memory transistors MTr are formed in each columnar portion $CL_{mn}$ so that they are connected in series. Accordingly, in each memory string $MS_{mn}$, four memory transistors MTr are connected in series in a respective one of two columnar portions $CL_{mn}$ that are connected to a joining portion $JP_{mn}$. As such, each memory string $MS_{mn}$ has a total of 2×4=8 memory transistors MTr arranged therein (see FIG. 4).

In addition, as illustrated in FIG. 2, a back-gate transistor $BGTr_{mn}$ is formed at one joining portion $JP_{mn}$ (see FIG. 4). A back-gate conductive layer (back-gate line) BG is formed under the joining portion $JP_{mn}$ via an insulation film, not illustrated in FIG. 2. The back-gate line BG functions as the gate electrodes of the back-gate transistors $BGTr_{mn}$. The back-gate line BG may be in a plate-like form, provided in common to all of the memory strings MS in one block. That is, all of (m×n) back-gate transistors BGTr in one block may be controlled by one back-gate line BG. However, these transistors may be divided in a stripe pattern with the row direction taken as their longitudinal direction.

In addition, word lines $WL_m$ are arranged at the same arrangement pitch as that of the columnar portions $CL_{mn}$ so that each of the word lines surrounds one of the columnar portions $CL_{mn}$ via an insulation film. As illustrated in FIG. 1, even-numbered word lines WLm provide a comb-like wiring to which they are commonly connected, and odd-numbered word lines WLm provide another comb-like wiring to which they are commonly connected. The two comb-like wirings are arranged so that respective "comb-tooth" parts are meshed with each other. Such comb-like wirings are employed for the purpose of reducing the number of contacts. However, the word lines WLm may be separately connected to the contacts, respectively, without using such comb-like wirings.

In addition, as illustrated in FIG. 3, each insulation film, which is formed between a word line $WL_m$ and a columnar portion $CL_{mn}$ as described above, is formed by an ONO (Oxide-Nitride-Oxide) layer NL. Each ONO layer NL has a tunnel insulation layer TI in contact with a columnar portion $CL_{mn}$, an electric charge storage layer EC in contact with the tunnel insulation layer TI, and a block insulation layer BI in contact with the electric charge storage layer EC. Each electric charge storage layer EC has a function for accumulating electric charges. That is, each electric charge storage layer EC is formed to surround the side surface of a columnar portion $CL_{mn}$.

In addition, each word line $WL_{mn}$ is formed to surround the side surface of a columnar portion $CL_{mn}$ and an electric charge storage layer EC. The columnar portions $CL_{mn}$ and the corresponding joining portion $JP_{mn}$ are formed in a tubular form having a hollow portion HI therein, which is filled with an insulation film I such as a silicon oxide film. The columnar portions and the corresponding joining portion may also be filled up with, including their interior parts, a conductive film such as polysilicon, without such a hollow portion HI.

In addition, selection gate lines SG are formed above the word lines $WL_{mn}$ as wirings for connection with the selection transistors $SDTr_{mn}$ and $SSTr_{mn}$. Each of the selection gate lines SG is formed to surround one columnar portion $CL_{mn}$ via an insulation film GI (see FIG. 3), with the row direction taken as its longitudinal direction.

Each back-gate transistor $BGTr_{mn}$ includes a joining portion $JP_{mn}$, an ONO layer NL (an electric charge storage layer EC), and the back-gate line BG. Those ends of the back-gate line BG that come in contact with the ONO layers NL function as the control gate electrodes of the back-gate transistors $BGTr_{mn}$.

Referring now to the plan view of FIG. 5, a configuration of the memory cell array 12 according to the first embodiment will be described in further detail below. FIG. 6 is an enlarged view of part A (surrounded by the broken line) of FIG. 5. In addition, in FIGS. 5 and 6, those ends BE are indicated by cross-hatching at which memory strings MS are connected to bit lines BL, while other ends SE are indicated by oblique hatching at which memory strings MS are connected to source lines SL. Note that the selection gate lines SG are omitted from FIG. 5 for simplicity.

As described above, the bit lines BL are arranged at a certain arrangement pitch with the column direction taken as their longitudinal direction. The source lines SL are arranged at the same arrangement pitch as that of the bit lines BL with the column direction also taken as their longitudinal direction, so that each source line is inserted between two bit lines BL. That is, the bit lines BL and the source lines SL are arranged to alternate with one another in the row direction.

Figure 5:
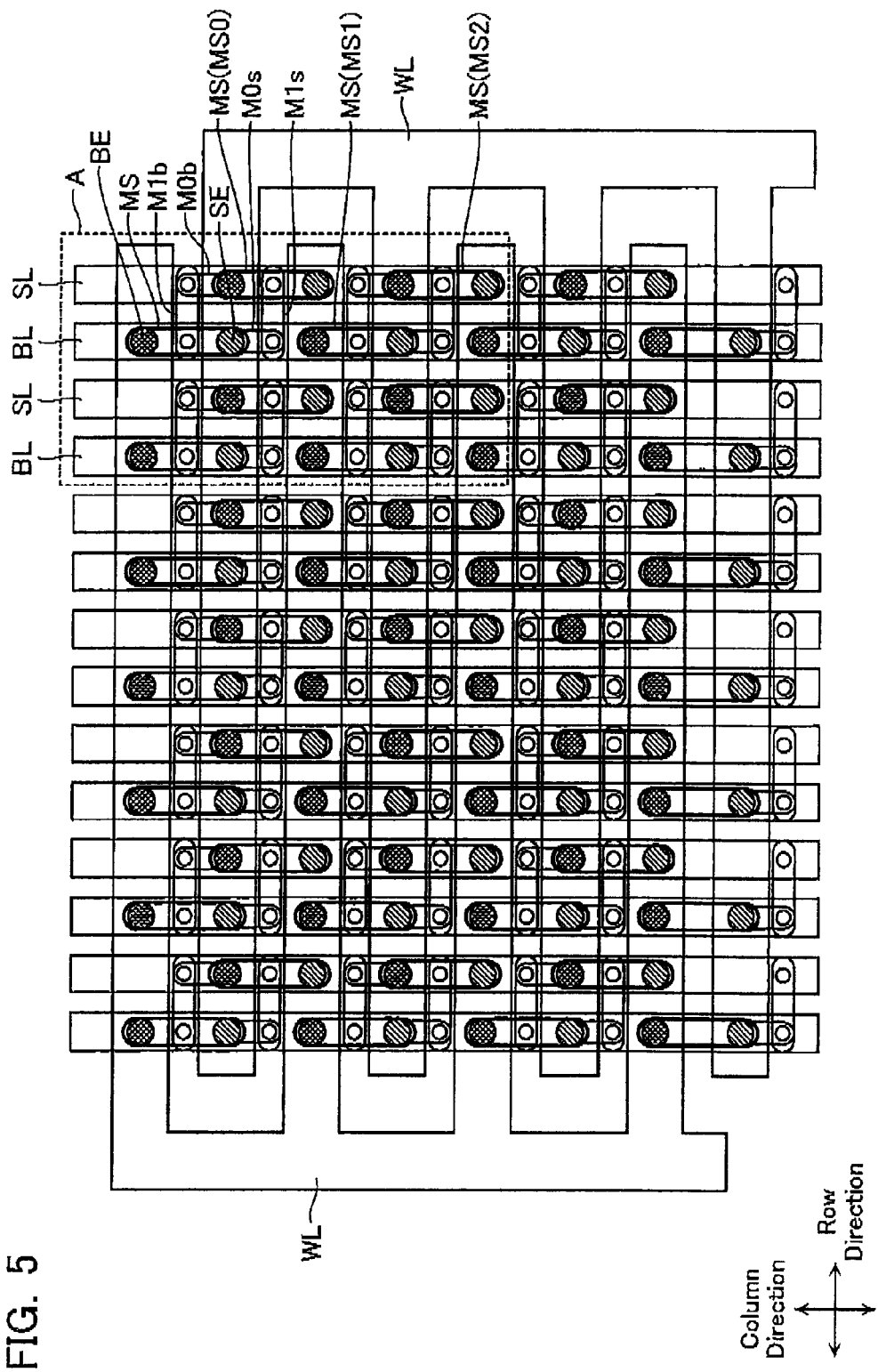
FIG. 5 is a plan view illustrating a configuration of the memory cell array 12 according to the first embodiment.
Figure 6:
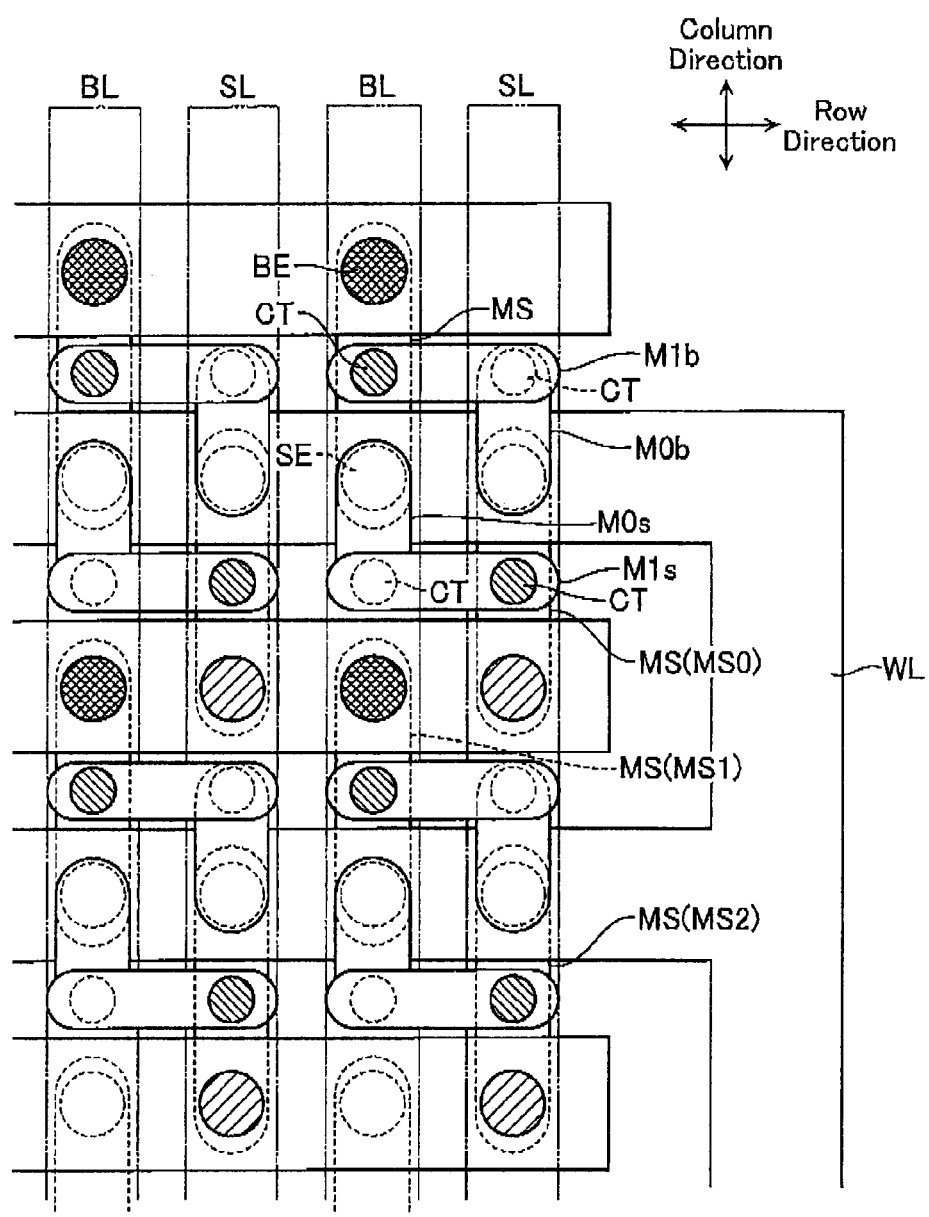
FIG. 6 is an enlarged view of part A of FIG. 5.

As illustrated in FIG. 5, a plurality of memory strings MS that are aligned in the row direction in the memory cell array 12 have their respective ends BE and SE staggered with respect to each other in the column direction, as it were in a houndstooth pattern (zig-zag pattern). In other words, the ends BE and SE alternately appear in the row direction for the memory strings MS adjacent in the row direction, and these alternating ends BE and SE share the same word line WL and selection gate line SG. For example, in FIG. 5, the end SE of a memory string MS0 and the end BE of a memory string MS1 adjacent to the memory string MS0 in the row direction are aligned with each other along one word line WL and one selection gate line SG. As such, the memory strings MS0 and MS1 share four word lines WL, that are connected to four memory transistors MTr formed along a respective one columnar portion $CL_{mn}$ in each memory string. Reversing the argumentation, the remaining four word lines WL are not shared between the memory strings MS0 and MS1.

In addition, the one selection gate line SG shared by the memory strings MS0 and MS1 functions as a drain-side selection gate line SGD in the memory string MS1 and as a source-side selection gate line in the memory string MS0. The memory strings MS are arranged in this zig-zag pattern in order to avoid a situation where multiple adjacent memory strings MS are selected at the same time. This will be discussed in more detail later. Note that adjacent memory cells MS1 and MS2 in FIG. 5 are also connected in substantially the same relation as that between the above-mentioned memory cells MS0 and MS1.

The memory strings MS are arranged immediately either below bit lines BL or source lines SL with the column direction taken as their longitudinal direction. That is, both ends BE and SE in one memory string MS exist immediately below either one bit line BL or one source line SL.

Thus, as illustrated in FIGS. 2, 5 and 6, connection wirings M0s and M1s are provided as configurations for connecting the ends SE positioned immediately below the bit lines BL with the corresponding source lines SL. Connection wirings M0b and M1b are also provided as configurations for connecting the ends BE positioned immediately below the source lines SL with the corresponding bit lines BL.

As illustrated in FIG. 6, each connection wiring M0s is formed below each connection wiring M1s with the column direction taken as its longitudinal direction. The bottom surface of each connection wiring M0s is connected to an end SE (the upper end of a columnar portion CLmn). In addition, each connection wiring M1s is formed with the row direction taken as its longitudinal direction, and its bottom surface is electrically connected to a connection wiring M0s via a contact CT. The top surface of each connection wiring M1s is connected to a source line SL via a contact. Note that the connection between each connection wiring M0s and each end SE may be provided via a contact.

Similarly, each connection wiring M0b is formed below each connection wiring M1b with the column direction taken as its longitudinal direction. The bottom surface of each connection wiring M0b is connected to an end BE (the upper end of a columnar portion CLmn). In addition, each connection wiring M1b is formed with the row direction taken as its longitudinal direction, and its bottom surface is electrically connected to a connection wiring M0b via a contact CT. The top surface of each connection wiring M1b is connected to a bit line BL via a contact CT. Note that the connection between each connection wiring M0b and each end BE may be provided via a contact.

In addition, although not illustrated in FIG. 5, the selection gate lines SG are arranged at the same arrangement pitch as that of the word lines WL with the row direction taken as their longitudinal direction, and are orthogonal to the bit lines BL and the source lines SL.

With this configuration, a plurality of memory string MS (e.g., the memory strings MS0, MS1, MS2 in FIG. 5) are connected in parallel to a pair of a bit line BL and a source line SL. To select one of a plurality of memory string MS hanging down from one such bit line BL, a certain voltage is applied to one selection gate line SG.

Figure 7:
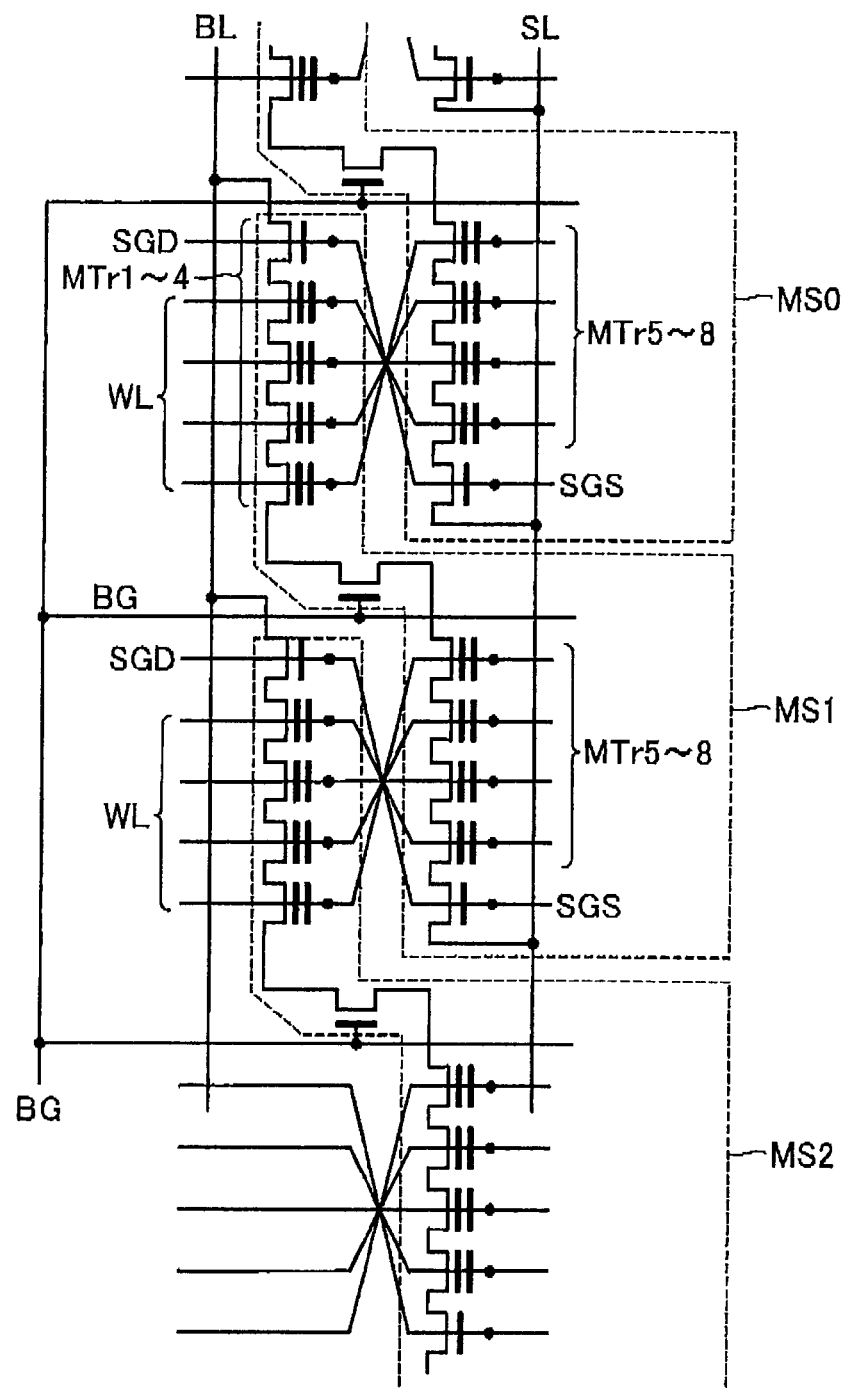
FIG. 7 is an equivalent circuit diagram of the memory cell array 12 according to the first embodiment.

Referring now to FIG. 7, an equivalent circuit diagram of the memory cell array 12 so configured will be described below. This equivalent circuit diagram of FIG. 7 is a circuit diagram focusing on the above-mentioned three adjacent memory strings MS0, MS1, MS2.

As illustrated in FIG. 7, in two adjacent memory strings MS1 and MS2, four of eight memory transistors MTr in each memory string that are positioned along a respective one columnar portion $CL_{mn}$ share word lines WL, while the remaining four share the other word lines WL with another memory string. That is, in the memory strings MS1 and MS2, the remaining four memory transistors MTr are control led by independent word lines WL.

Figure 8:
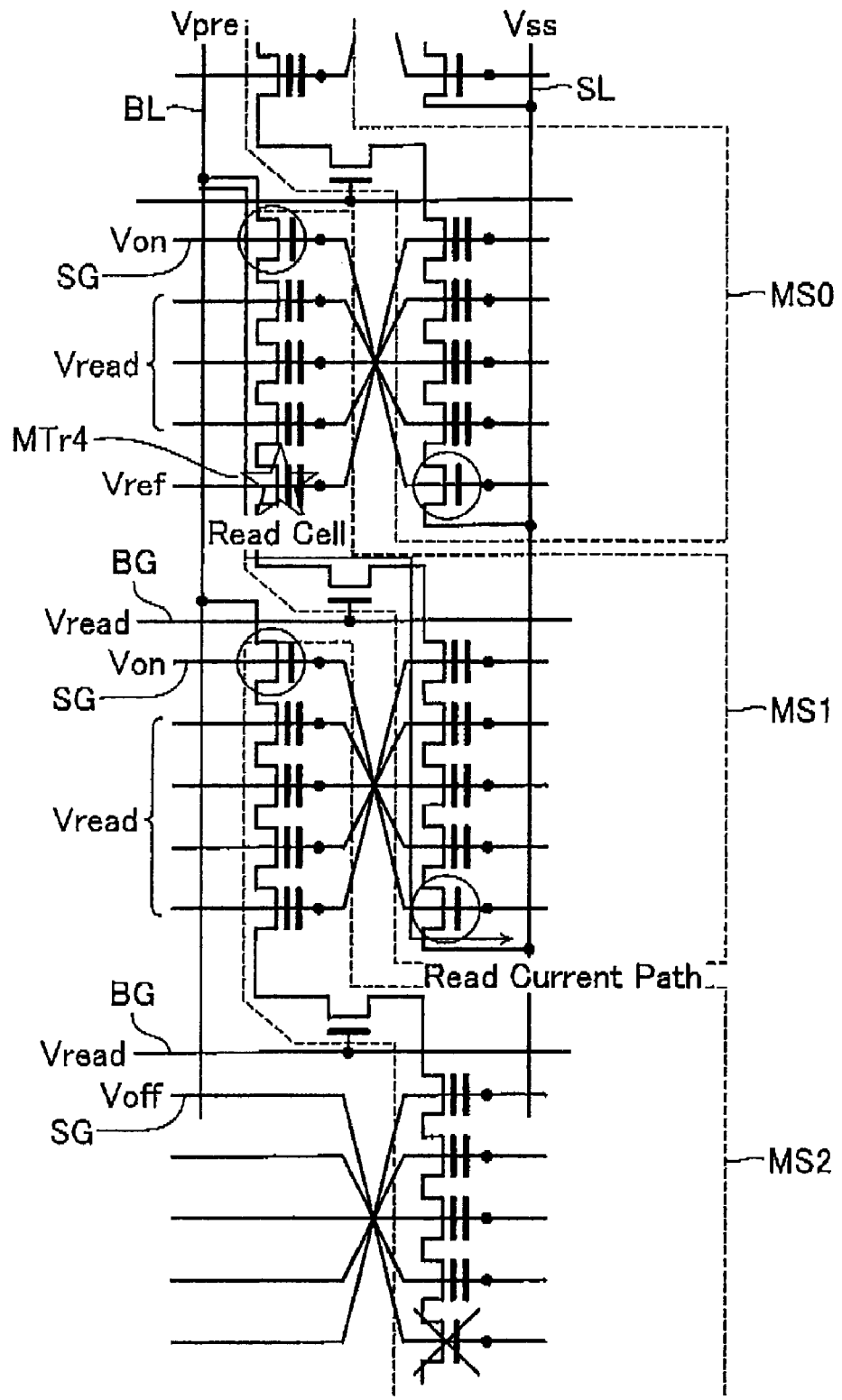
FIG. 8 is a circuit diagram illustrating a read operation of the semiconductor storage device of the first embodiment.

Referring now to FIG. 8, a data read operation of the non-volatile semiconductor storage device of the first embodiment will be de scribed below. As an example, in FIG. 8, consider that a memory transistor MTr4, marked with a star, in the memory string MS1 is a read cell for reading. In this case, the bit line BL to which the memory string MS1 is connected is precharged to a power supply voltage VDD. In addition, the word line WL connected to the memory transistor MTr4 is applied with a determination voltage Vref which is approximately intermediate between multiple threshold voltage distributions. On the other hand, the word lines WL connected to the other memory transistors MTr1 to 3 and MTr5 to 8 are applied with a read voltage Vread which causes the memory transistors MTr to be conductive regardless of the retained data. Furthermore, an on voltage Von is applied to the selection gate lines SG of the selection transistors SSTr and SDTr at each end of the memory string MS1.

Upon application of these voltages, the read voltage Vread and the determination voltage Vref are also applied to the control gate electrodes of the memory transistors MTr5 to 8 in the memory string MS0 adjacent to the memory string MS1. However, in this memory string MS0, a ground potential Vss is applied to the selection gate line SG of the drain-side selection transistor SDTr (not illustrated in FIG. 8) that does not share the selection gate line SG with the memory string MS1. As a result, the drain-side selection transistor SDTr is maintained in a non-conductive state. Consequently, no current path is formed in the memory string MS0.

Similarly, the memory string MS2 also shares four word lines WL with the memory string MS1, which word lines are applied with the read voltage Vread. As such, in the memory string MS2, the corresponding four memory transistors MTr are brought into conductive states. However, the remaining memory transistors MTr are not applied with the read voltage Vread or the like, and the corresponding source-side selection transistor SSTr is maintained in a non-conductive state. Again, no current path is formed in the memory string MS2.

As can be seen from the above operation, only one of a plurality of memory string MS can be selected arbitrarily that are formed along a pair of a bit line BL and a source line SL. In this embodiment, this operation is ensured by arranging the memory strings MS in a zig-zag pattern on a plane. In addition, only one of the memory strings MS allows read current to flow into one source linen even if a multiple-bit read operation is performed by activating a plurality of bit lines BL at the same time. Therefore, this embodiment may suppress the potential floating of source lines SL as compared with the conventional technology where read current from a plurality of memory strings MS flows into one source line SL. As a result, this embodiment may reduce variations in the read current and providing a larger read margin. In addition, suppressing the potential floating of source lines SL may yield larger read current and reduce reading time.

Figure 9A:
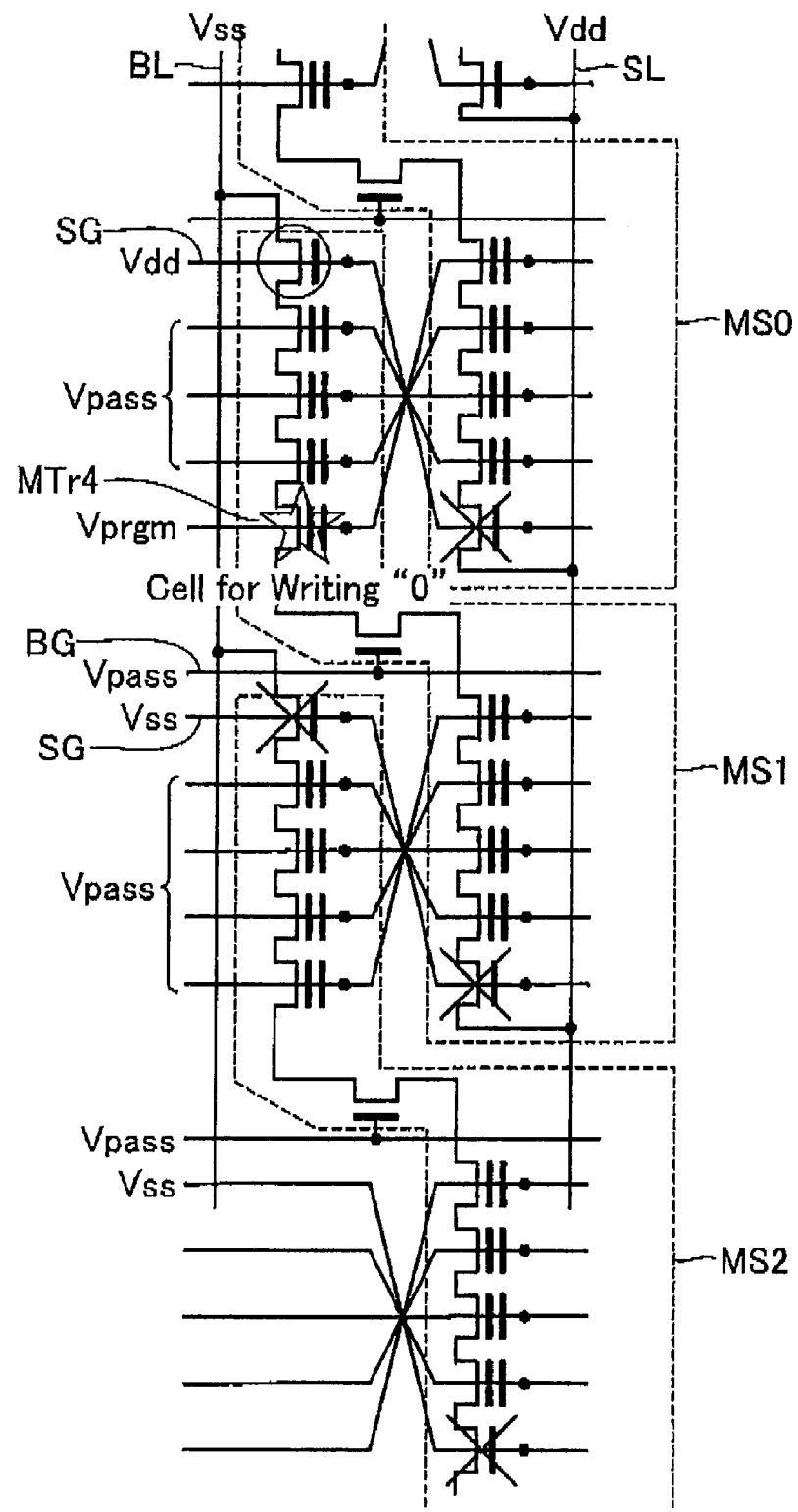
FIG. 9A is a circuit diagram illustrating a write operation of the semiconductor storage device of the first embodiment.
Figure 9B:
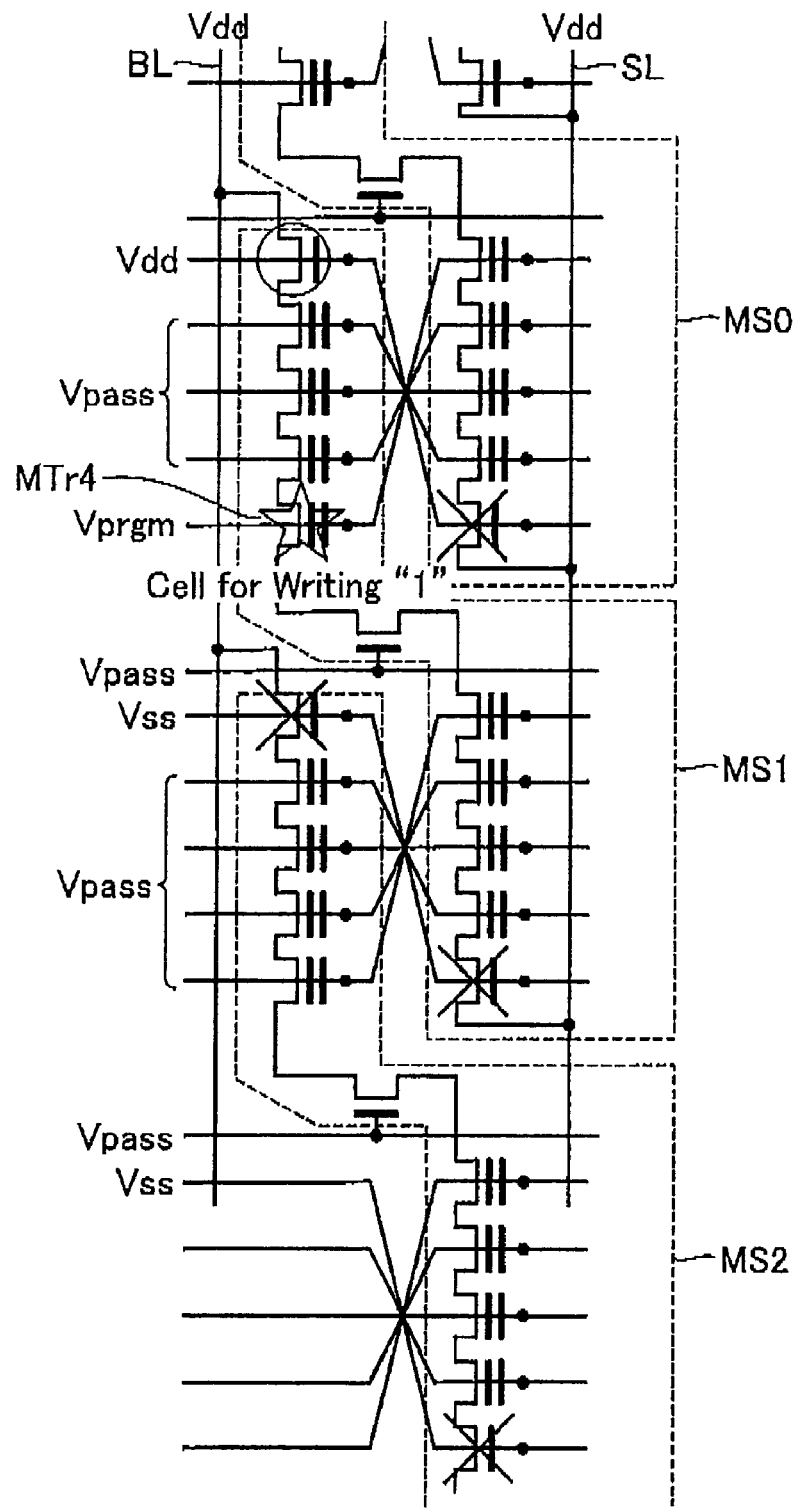
FIG. 9B is a circuit diagram illustrating a write operation of the semiconductor storage device of the first embodiment.

Referring now to FIGS. 9A and 9B, a data write operation of the non-volatile semiconductor storage device of the first embodiment will be described below. FIG. 9A conceptually illustrates an operation when writing "0"; and FIG. 9B conceptually illustrates an operation when writing "1". In either case, as an example, consider that a memory transistor MTr4, marked with a star, in the memory string MS1 is a write cell for writing.

In this case, as with conventional NAND-cell-type flash memory, the word line WL of the memory transistor MTr4 is applied with a program voltage Vpgm of not less than 20V, and the other word lines WL are applied with a pass voltage Vpass of on the order of 8V. Note that the bit lines BL are applied with a voltage depending on the write data (ground voltage Vss when writing "0", or power supply voltage Vdd when writing "1"). Thus, these voltages are also applied to the memory strings MS0 and MS2 that are adjacent to the memory string MS1 and share the word lines WL with each other. However, since an off voltage is applied to the selection gate SG of the source-side selection transistor SSTr of the memory string MS1, the drain-side selection transistor SDTr of the memory string MS2 is also in a non-conductive state. Thus, the write operation is not performed in the memory string MS2. In the memory string MS0, the selection transistor (not illustrated in FIG. 9) that does not share the selection gate line SG with the memory string MS1 is maintained in a non-conductive state. On the other hand, the source-side selection transistor in the memory string MS0 that shares the selection gate line SG with the memory string MS1 is in a conductive state before voltage is applied to the word lines WL. Thereafter, once the voltage of the word lines WL increases to the voltage VPass or voltage Vpgm, the channel potential increases due to coupling. At this point, when the channel potential becomes equal to or higher than the voltage Vdd, the source-side selection transistor of the memory string MS0 switches to a non-conductive state. Again, the write operation is not performed in the memory string MS0.

Second Embodiment

Figure 10:
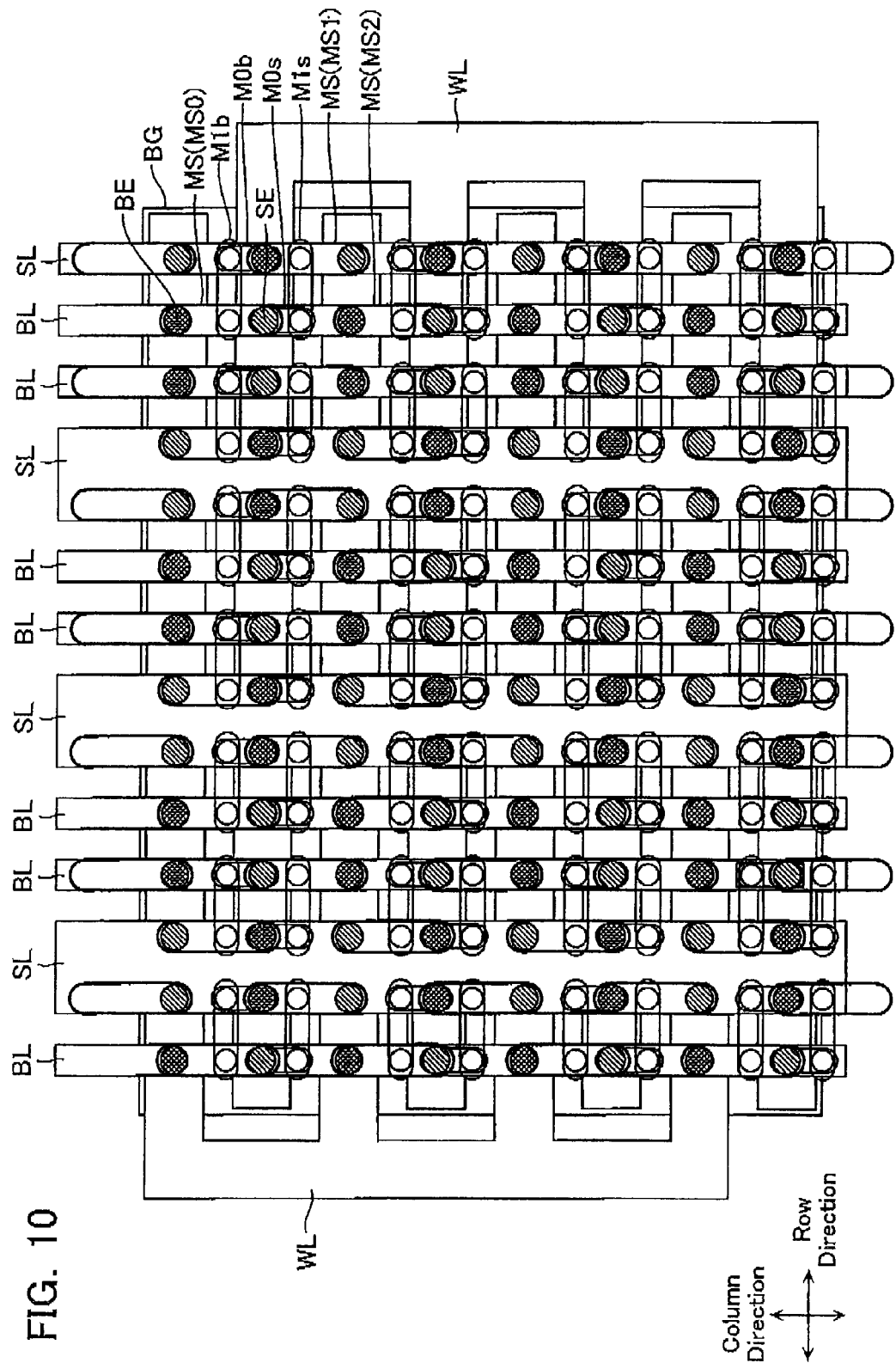
FIG. 10 is a plan view of a non-volatile semiconductor storage device according to a second embodiment of the present invention.

Referring now to FIG. 10, a second embodiment of the present invention will be described below. FIG. 10 is a plan view of the non-volatile semiconductor storage device according to the second embodiment of the present invention. The structure of the memory strings MS (FIGS. 3 and 4) the structure of the word lines WL (FIG. 1), as well as the shapes and the arrangement of the back-gate line BG (FIG. 2), the selection gate lines SG and so on (FIGS. 1 and 2) in the memory cell array 12 are the same as the first embodiment, and so will not be described in detail below.

However, this embodiment is different from the first embodiment in that each source line SL has a larger width (length in the row direction) than that of each bit line BL. That is, each source line SL has a width to accommodate two memory strings MS aligned in the row direction, which is about three times the width of each bit line BL. A plurality of memory string MS aligned in the row direction are arranged in a zig-zag pattern so that their respective ends are staggered with respect to each other in the column direction, which is the same as described in the first embodiment. In addition, the ends BE and SE of the memory strings MS are connected in the same way as described in the first embodiment.

According to this embodiment, each source line SL has a larger width and hence a smaller resistance, which may further suppress the potential floating of a source line SL in read operation.

Third Embodiment

Figure 11:
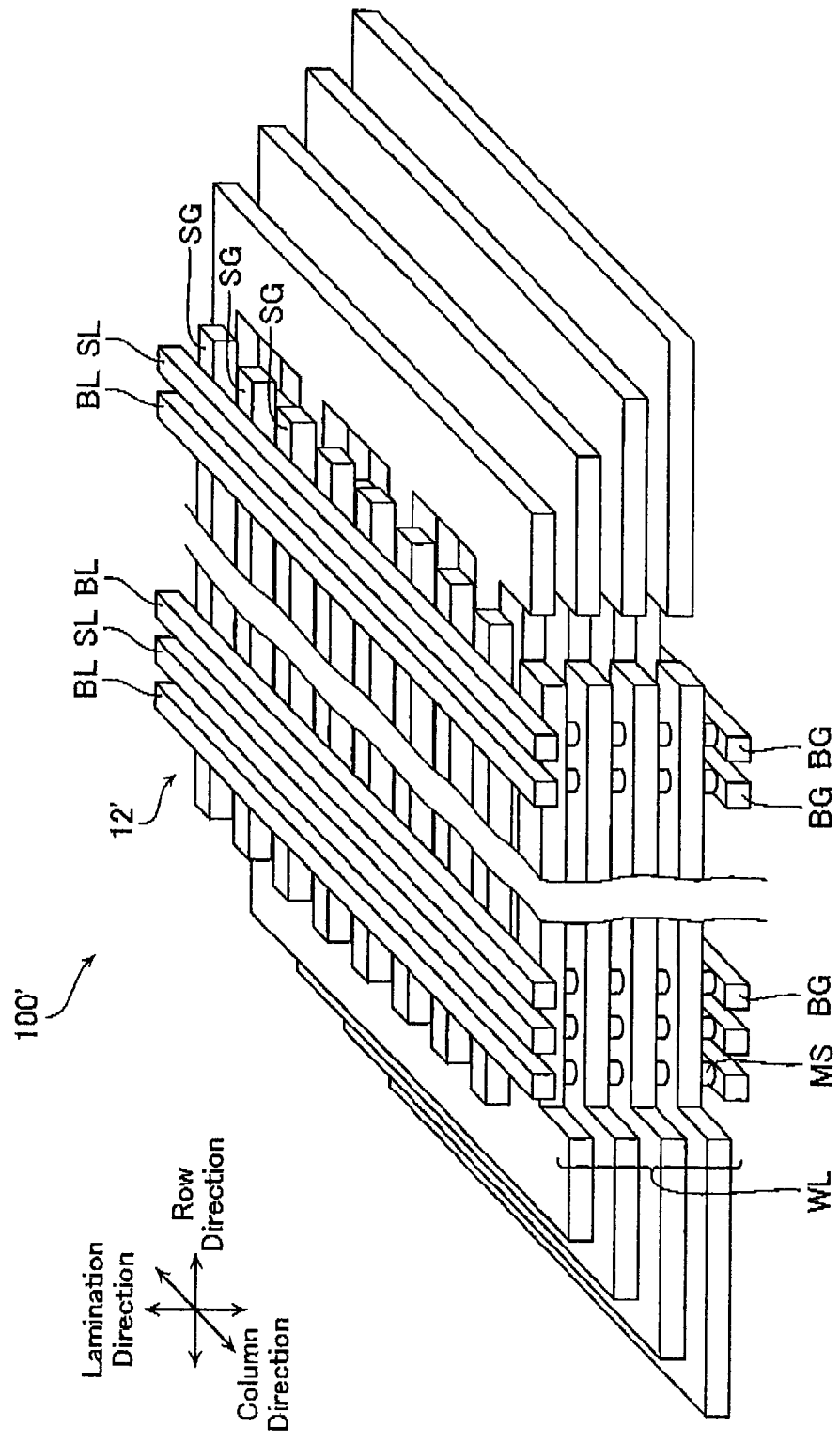
FIG. 11 is a schematic diagram illustrating an entire configuration of a non-volatile semiconductor storage device 100' according to a third embodiment of the present invention.

Referring now to FIG. 11 and so on, a third embodiment of the present invention will be described below.

Figure 12:
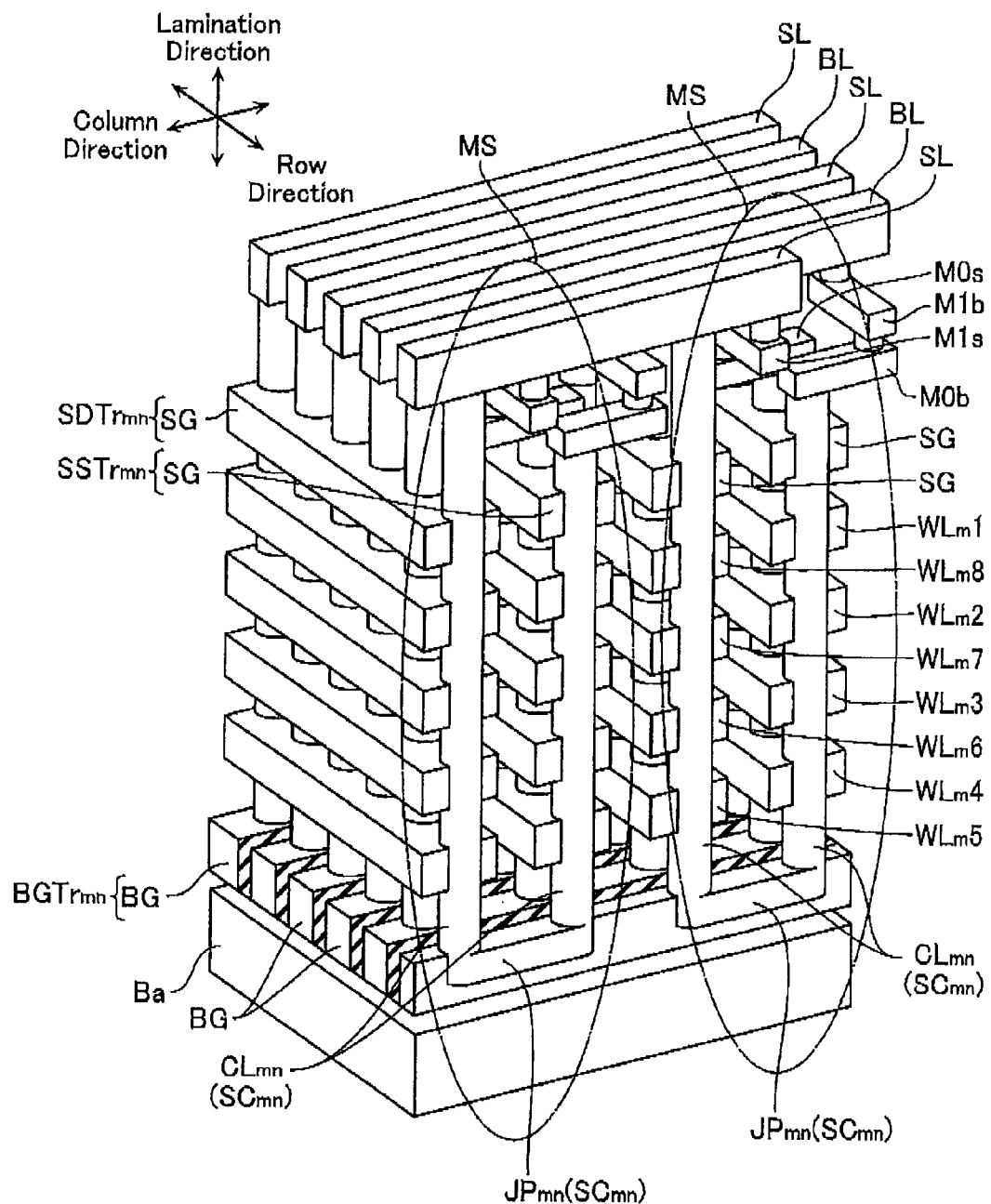
FIG. 12 is a schematic perspective view illustrating a part of one memory cell array 12' in the non-volatile semiconductor storage device 100' according to the third embodiment of the present invention.
Figure 13:
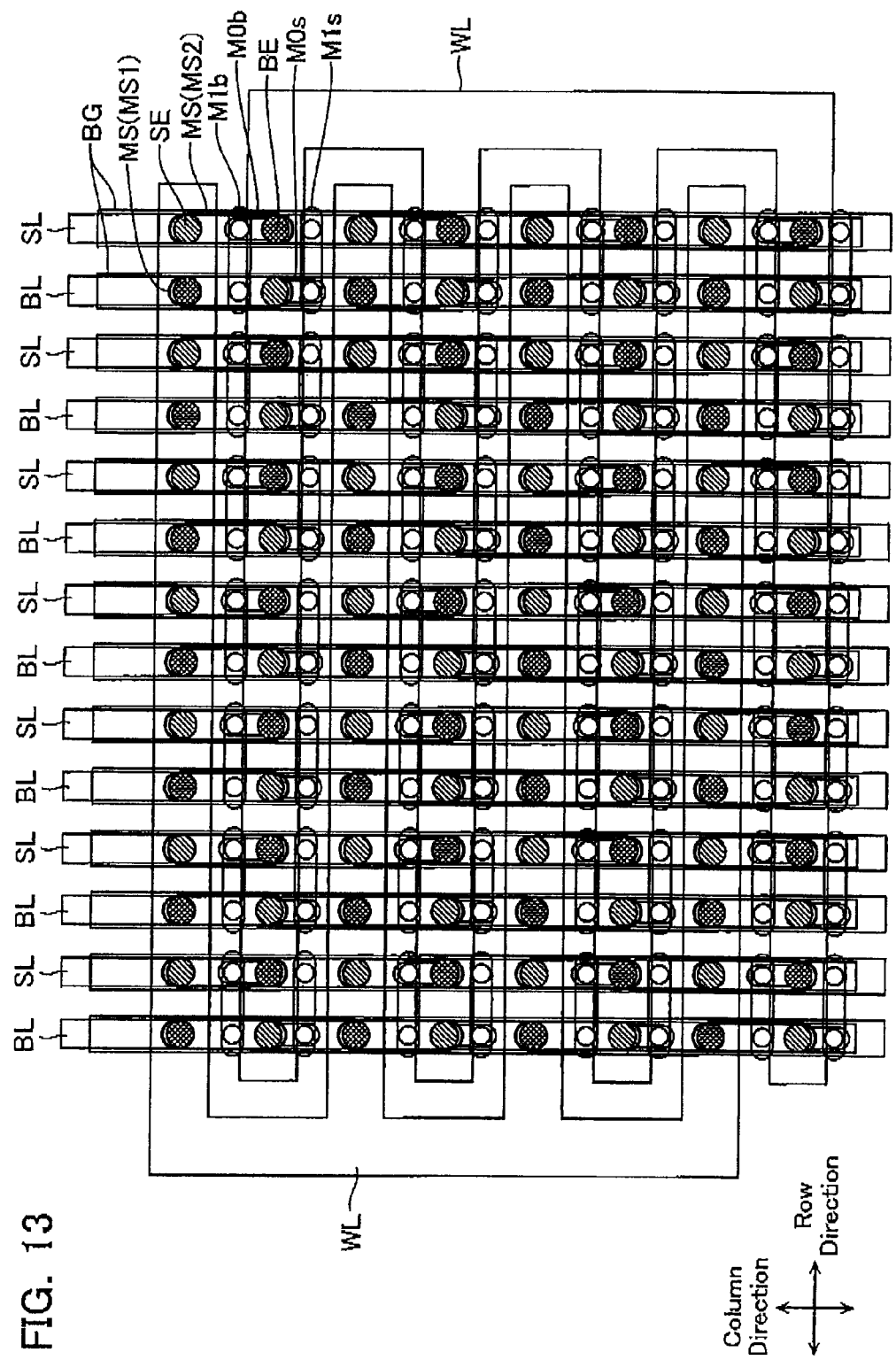
FIG. 13 is a plan view of the non-volatile semiconductor storage device according to the third embodiment of the present invention.

FIG. 11 schematically illustrates an entire configuration of a non-volatile semiconductor storage device 100' according to the third embodiment; and FIG. 12 is a schematic perspective view of a part of one memory cell array 12' in the non-volatile semiconductor storage device 100' according to the third embodiment. FIG. 13 is a plan view of the memory cell array 12' according to this embodiment.

The shapes and the arrangement of the word lines WL, the selection gate lines SG and so on in the memory cell array 12 are the same as the first embodiment, and so will not be described in detail below. The third embodiment is different from the above-described embodiments in that the back-gate lines BG are such wirings extending in the column direction and arranged in a stripe pattern at the same arrangement pitch as those of the bit lines BL and the source lines SL, rather than a plate-like wiring commonly connected to m×n memory strings MS.

In addition, as illustrated in FIG. 13, in the semiconductor storage device of the third embodiment, a plurality of memory string MS aligned in the row direction are arranged so that their respective ends are in line with each other. This is a difference from the above-described embodiments where the memory strings MS are arranged in a zig-zag pattern. Accordingly, as illustrated in the equivalent circuit diagram of FIG. 14, all of the memory transistors MTr and selection transistors SDTr and SSTr in the memory strings MS adjacent in the row direction are commonly connected to all of eight word lines WL and two selection gate lines SG. However, only the back-gate lines BG are not shared between the memory strings MS adjacent in the row direction. Each back-gate line BG is an independent wiring for each of the memory strings MS. The back-gate lines SG are thus formed in a stripe pattern. This allows the back-gate transistors BGTr to be controlled independently as illustrated in FIG. 15, in order to prevent another memory string adjacent to a selected memory string MS from being selected when performing a read operation on the selected memory string MS. As such, only one of a plurality of memory strings MS can be selected arbitrarily that are formed along a pair of a bit line BL and a source line SL. That is, since the back-gate lines BG are formed in a stripe pattern, one of the memory strings MS may be selected independently even though the plurality of the memory strings MS aligned in the row direction are arranged so that their respective ends are in line with each other.

Figure 16A:
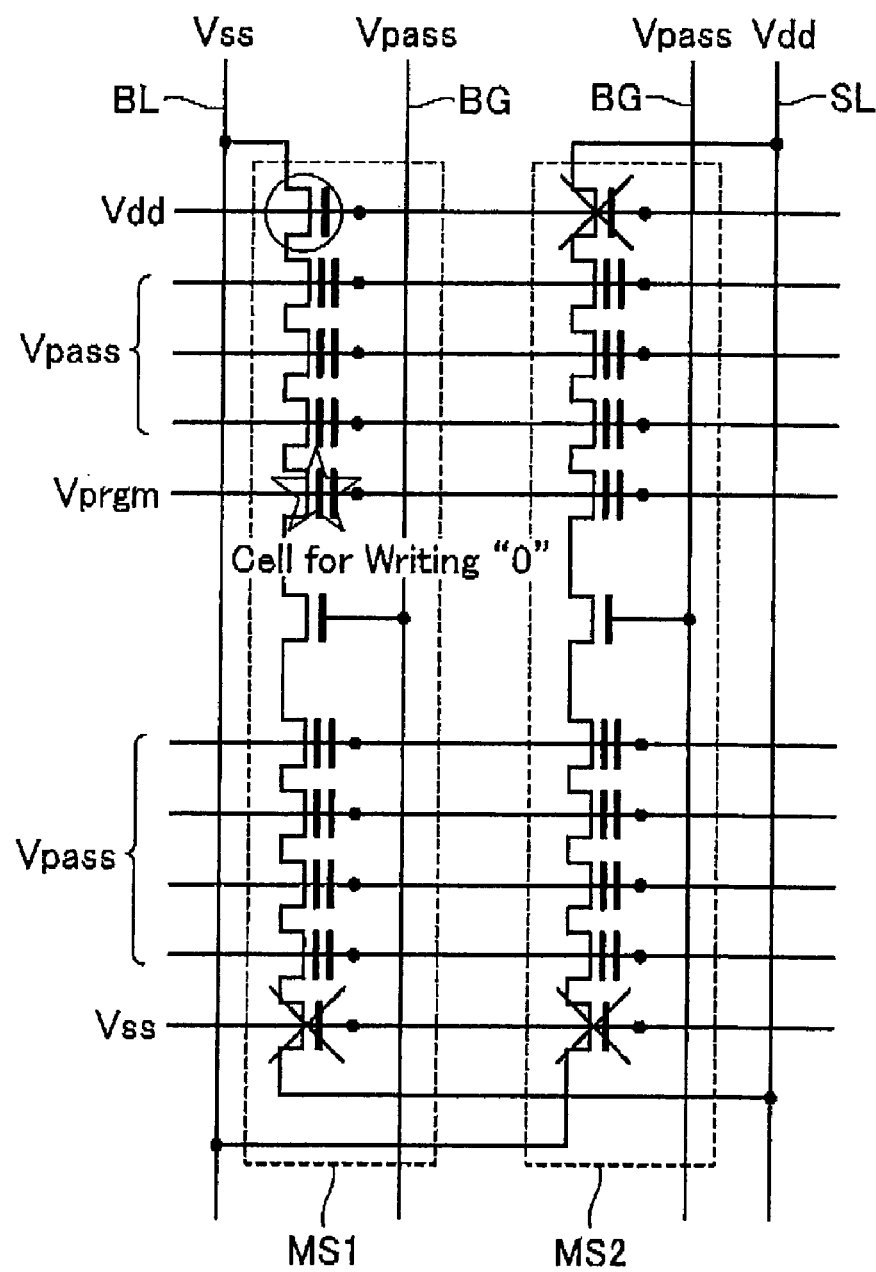
FIG. 16 is a circuit diagram illustrating a write operation of the semiconductor storage device of the third embodiment.
Figure 16B:
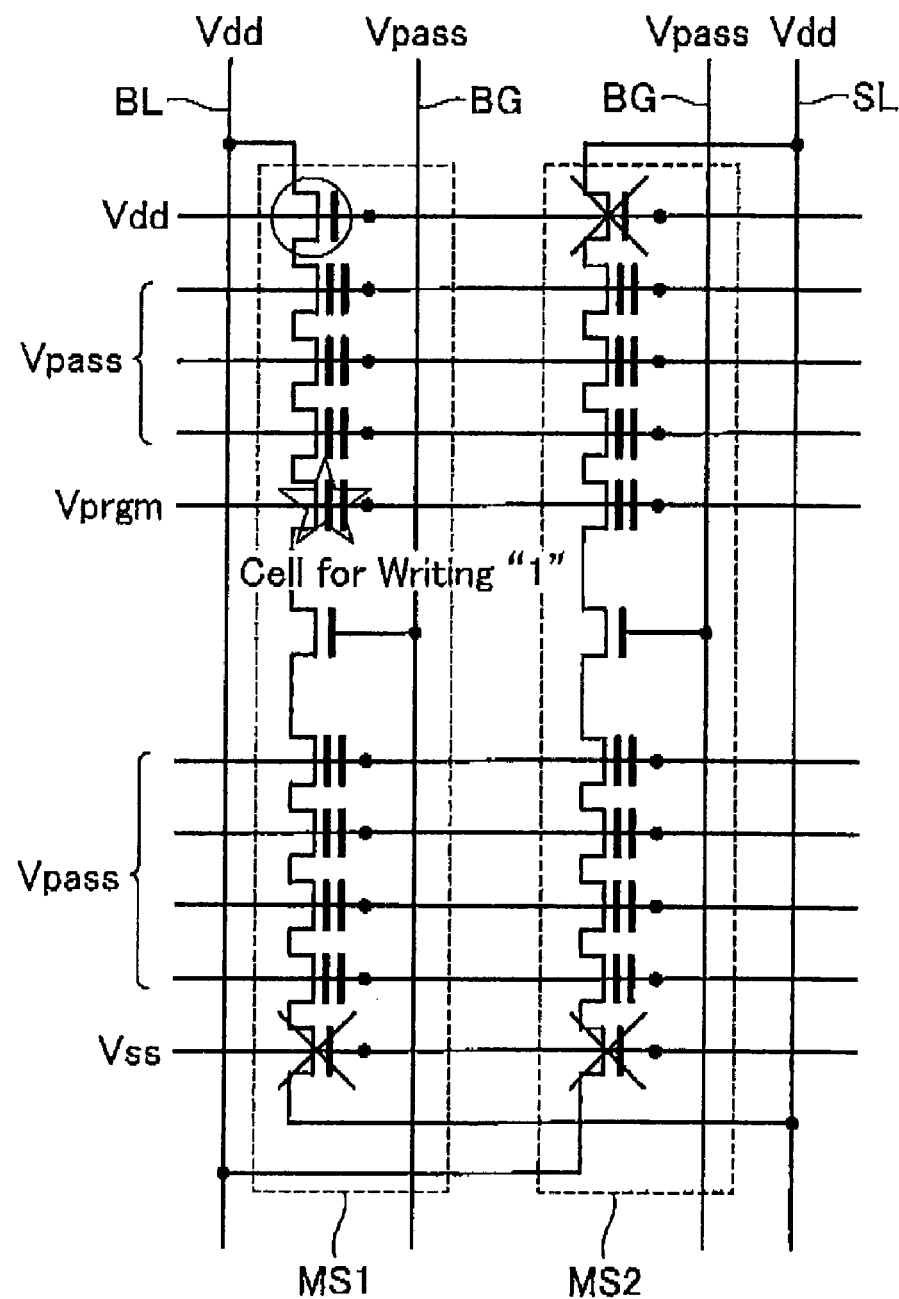

FIG. 16A illustrates an operation for writing "0" data according to this embodiment. FIG. 16B also illustrates an operation for writing "1" data according to this embodiment. In an unselected memory string MS2, while the voltage of the selection gate SG of the source-side selection transistor is the ground potential Vdd, the voltage Vdd is also applied to the source line SL, and hence the channels of the memory string MS2 are in floating states. Specifically, as the potential of the word lines WL increases to the voltage Vpass or Vpgm, the potential of the channels increases due to coupling between the word lines WL and the channels. Accordingly, the source-side selection transistor of the memory string MS2 is brought into a non-conductive state, and the channel parts of the memory string MS2 are brought into floating states. Thus, no write operation is performed to the memory cells in the memory string MS2.

Fourth Embodiment

Figure 17:
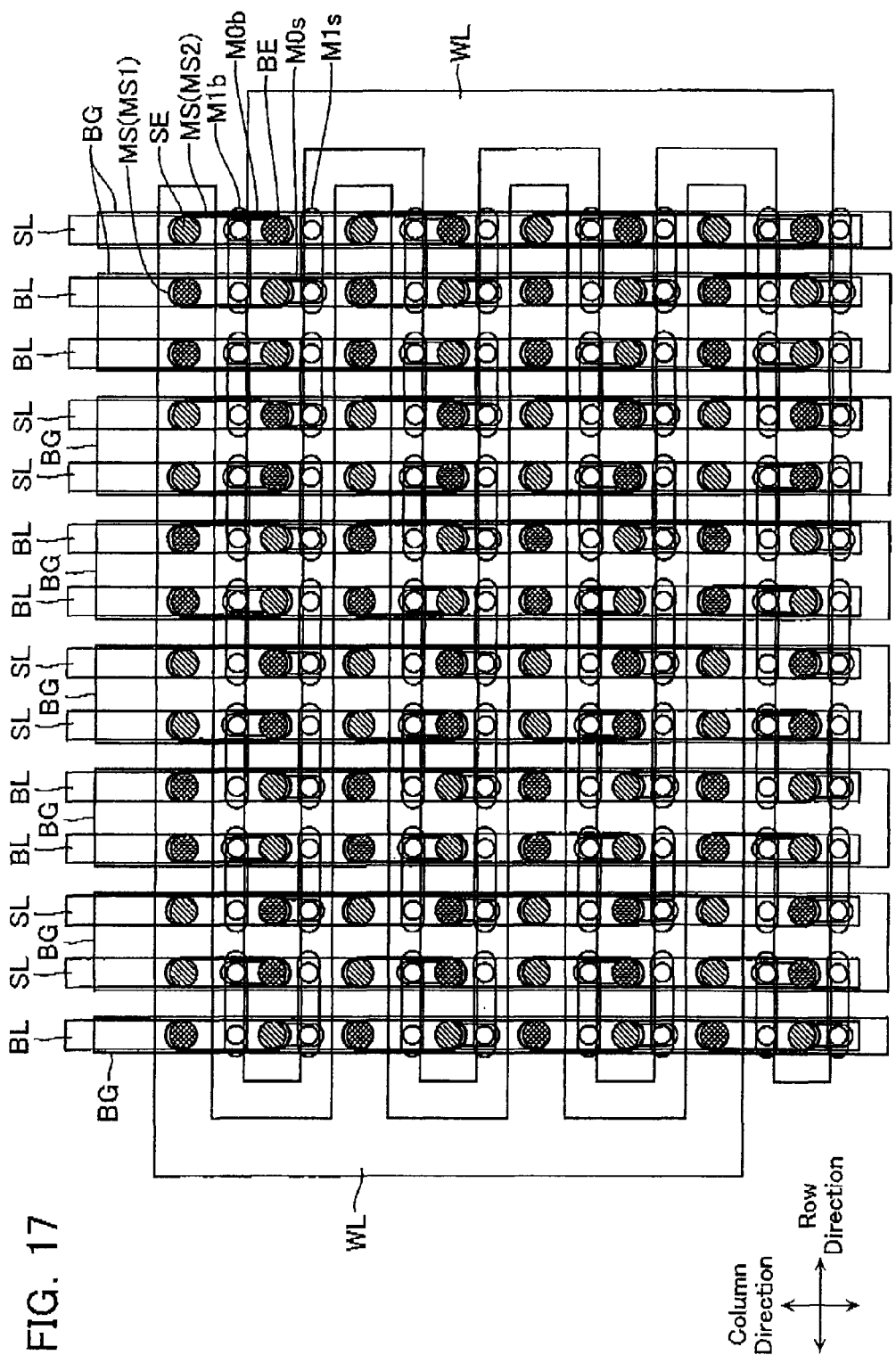
FIG. 17 is a plan view of one memory cell array in a non-volatile semiconductor storage device according to a fourth embodiment of the present invention.

Referring now to FIG. 17, a fourth embodiment of the present invention will be described below.

Figure 18:
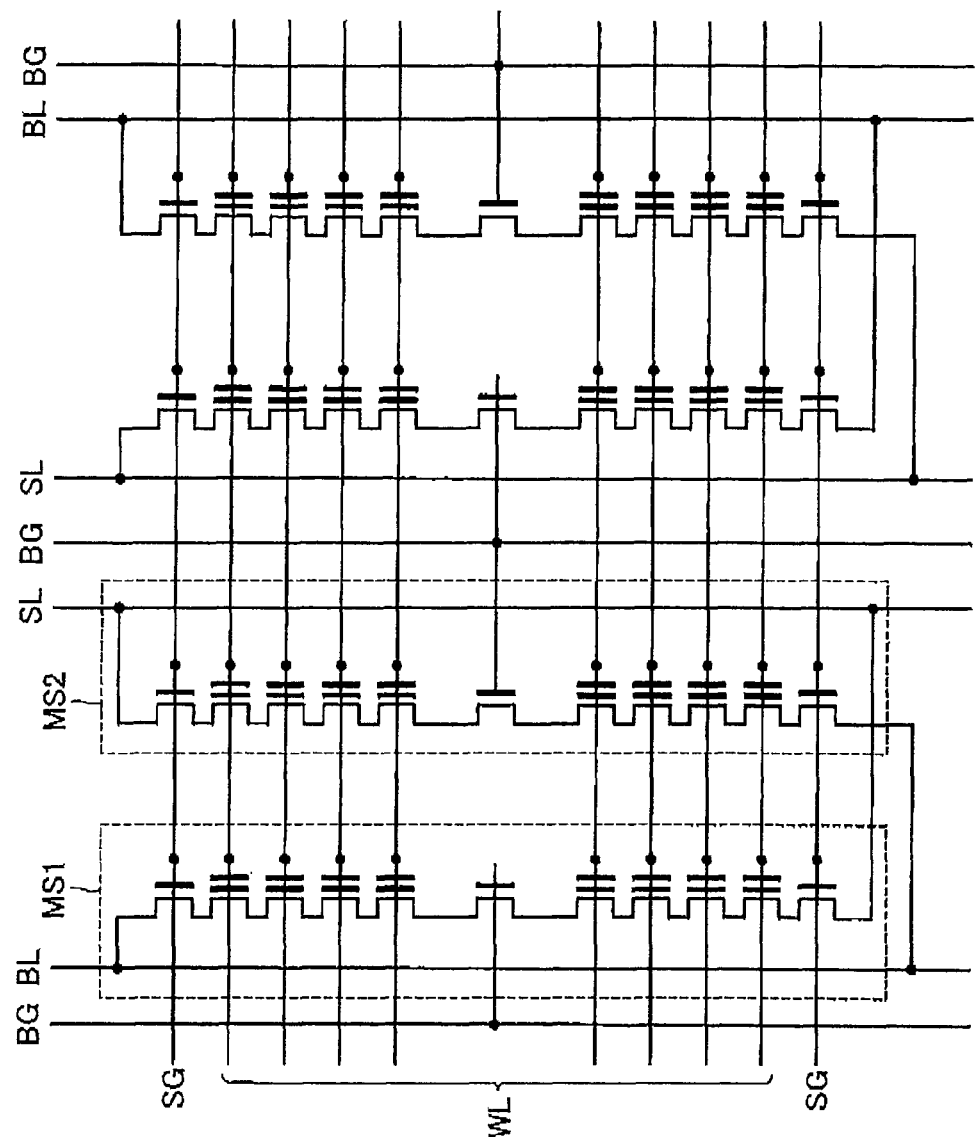
FIG. 18 is an equivalent circuit diagram of the memory cell array according to the fourth embodiment.
Figure 19:
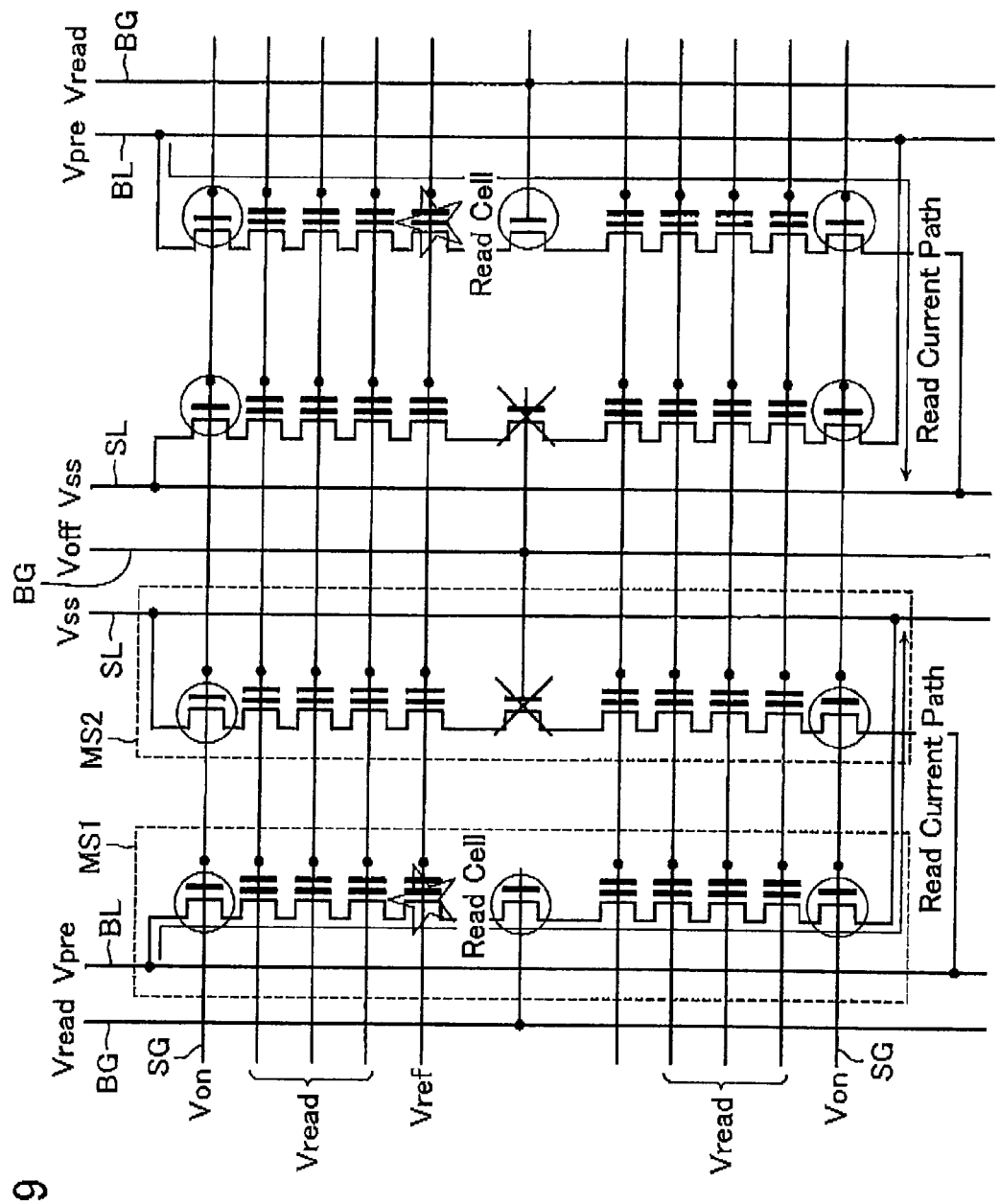
FIG. 19 is a circuit diagram illustrating a read operation of the semiconductor storage device according to the fourth embodiment of the present invention.
Figure 20:
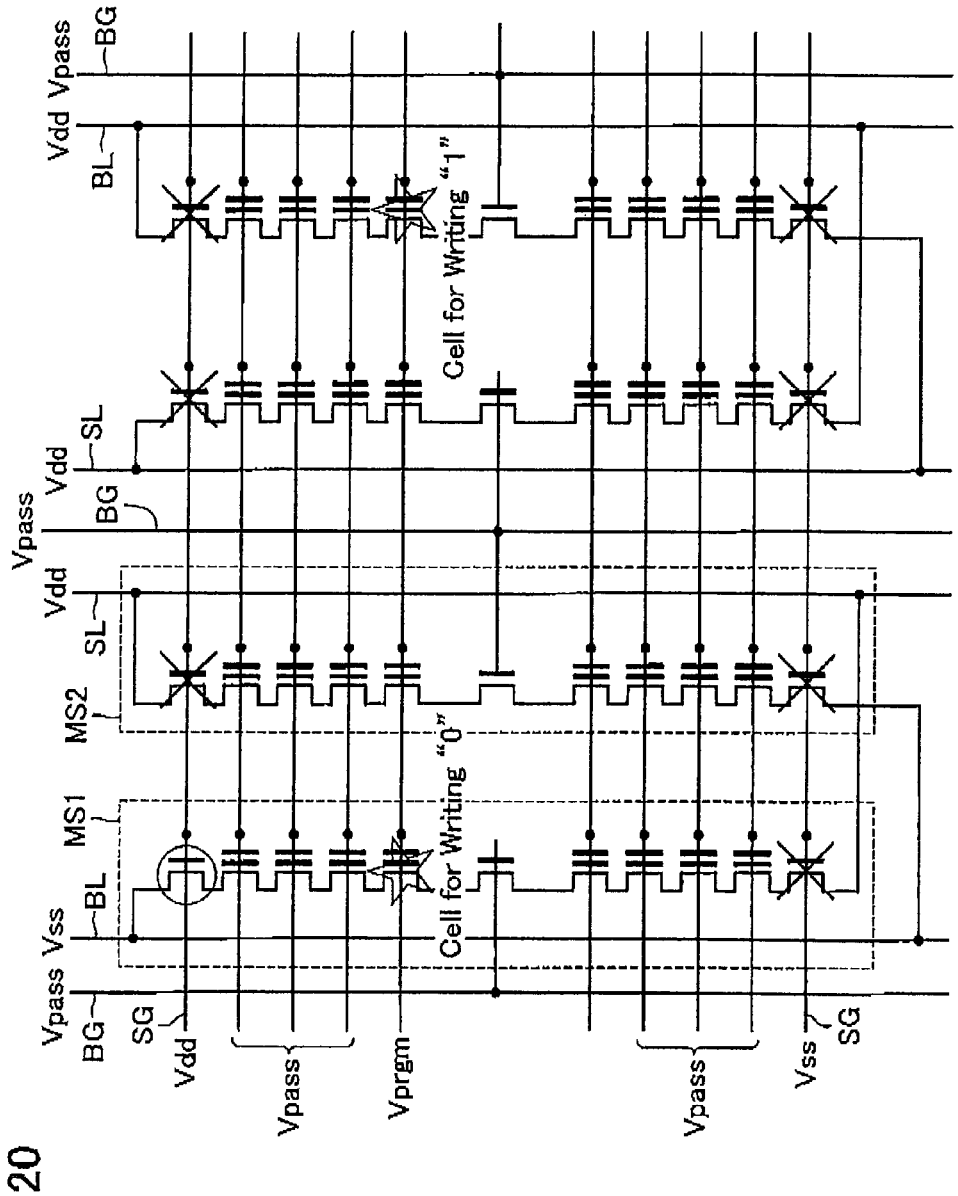
FIG. 20 is a circuit diagram illustrating a write operation of the semiconductor storage device according to the fourth embodiment of the present invention.

FIG. 17 is a plan view of one memory cell array in a non-volatile semiconductor storage device according to the fourth embodiment. FIG. 18 is an equivalent circuit diagram of the memory cell array according to the fourth embodiment. This embodiment is similar to the third embodiment in that the memory strings MS aligned in the row direction are arranged so that their respective ends are in line with each other in the column direction. However, unlike the third embodiment, the bit lines BL and the source lines SL are alternately formed two by two. Correspondingly, each back-gate line BG has a line width to accommodate two memory strings MS adjacent in the row direction. This embodiment is otherwise the same as the third embodiment. Thus, the equivalent circuit diagram as illustrated in FIG. 18 is substantially the same as the third embodiment, except the parts of the bit lines BL and the source lines SL. The read and write operations as illustrated in FIG. 19 (for read operation) and FIG. 20 (for write operation) are substantially the same as the third embodiment, and so are not be described in detail here. As such, the non-volatile semiconductor device of this embodiment has the same advantages as the third embodiment. That is, since the back-gate lines BG are formed in a stripe pattern, one of the memory strings MS may be selected independently even though the plurality of the memory strings MS aligned in the row direction are arranged so that their respective ends are in line with each other.

Fifth Embodiment

Figure 21:
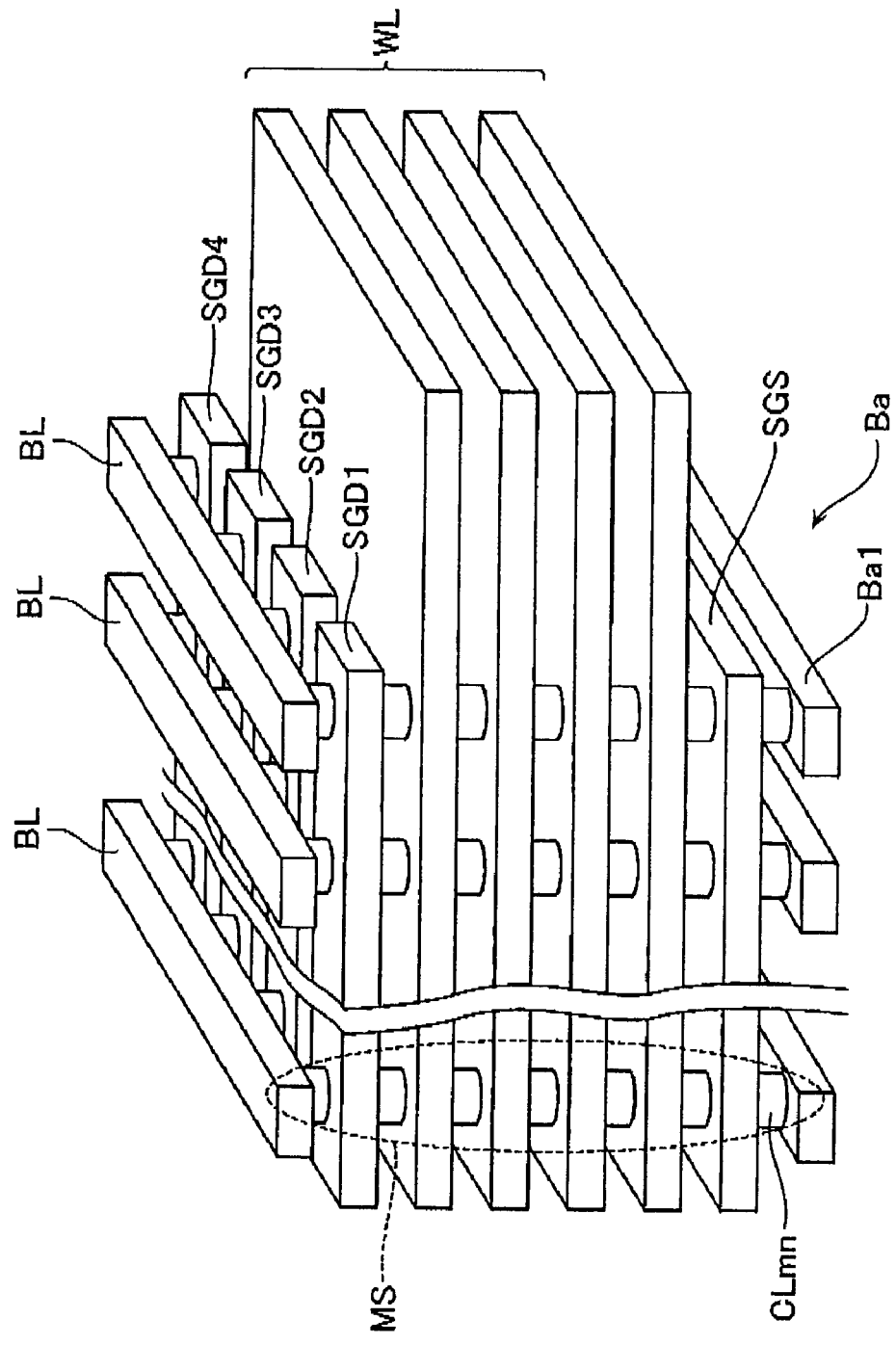
FIG. 21 is a schematic diagram illustrating an entire configuration of the non-volatile semiconductor storage device according to the fifth embodiment of the present invention.

Referring now to FIG. 21, a fifth embodiment of the present invention will be described below. This embodiment is different from the first embodiment in that one memory string MS has a body semiconductor layer of I-shape (one columnar semiconductor) as illustrated in FIG. 21, rather than U-shape as described in the above-described embodiments.

The bit lines BL are arranged at a certain arrangement pitch with the column direction taken as their longitudinal direction, and the source lines SL are also arranged at a certain pitch with the column direction taken as their longitudinal direction. Unlike the above embodiments, the bit lines BL and the source lines SL are not formed in the same layer; the source lines SL are provided in a lower layer below the bit lines BL. However, this embodiment is similar to the above embodiments in that the bit lines BL and the source lines SL are formed in parallel. In addition, this embodiment is similar to the above embodiments in that a plurality of (in this figure four) memory strings MS are connected in parallel between a pair of a bit line BL and a source line SL. These four memory strings are connected to independent drain-side selection gate lines SGD1 to 4, respectively. The drain-side selection gate lines SGD1 to 4 are arranged with the row direction, orthogonal to the bit lines BL and the source lines SL, taken as their longitudinal direction. Accordingly, for example, a plurality of selected memory strings MS are still connected to different source lines SL when a read operation is performed by causing a plurality of bit lines BL to go high at the same time. Therefore, the read current cannot be reduced due to the potential floating of source lines SL, which may ensure a sufficient reading speed and provide a larger read margin.

[Others]

While embodiments of the present invention have been described, the present invention is not intended to be limited to the disclosed embodiments, and various other changes, additions or the like may be made thereto without departing from the spirit of the invention. For example, the following cases have been described in the above-described embodiments: where the word lines WL and the selection gate lines SG are shared between (commonly connected to) only those memory transistors along one columnar portion $CL_{mn}$ in a plurality of memory strings MS connected to a pair of a bit line BL and a source line SL (the first and second embodiments); and where all of the word lines WL and the selection gate lines SG are shared between the memory transistors, while only the back-gate lines BG being provided independently (the third and fourth embodiments). However, the present invention is not so limited. Other configurations may fall within the scope of the invention where a plurality of memory strings connected to a pair of a bit line and a source line can share at least some of the word lines or selection gate lines, and the voltage of some of the remaining wirings can be controlled independently, allowing arbitrary activation of only one of the plurality of memory strings.

Figure 14:
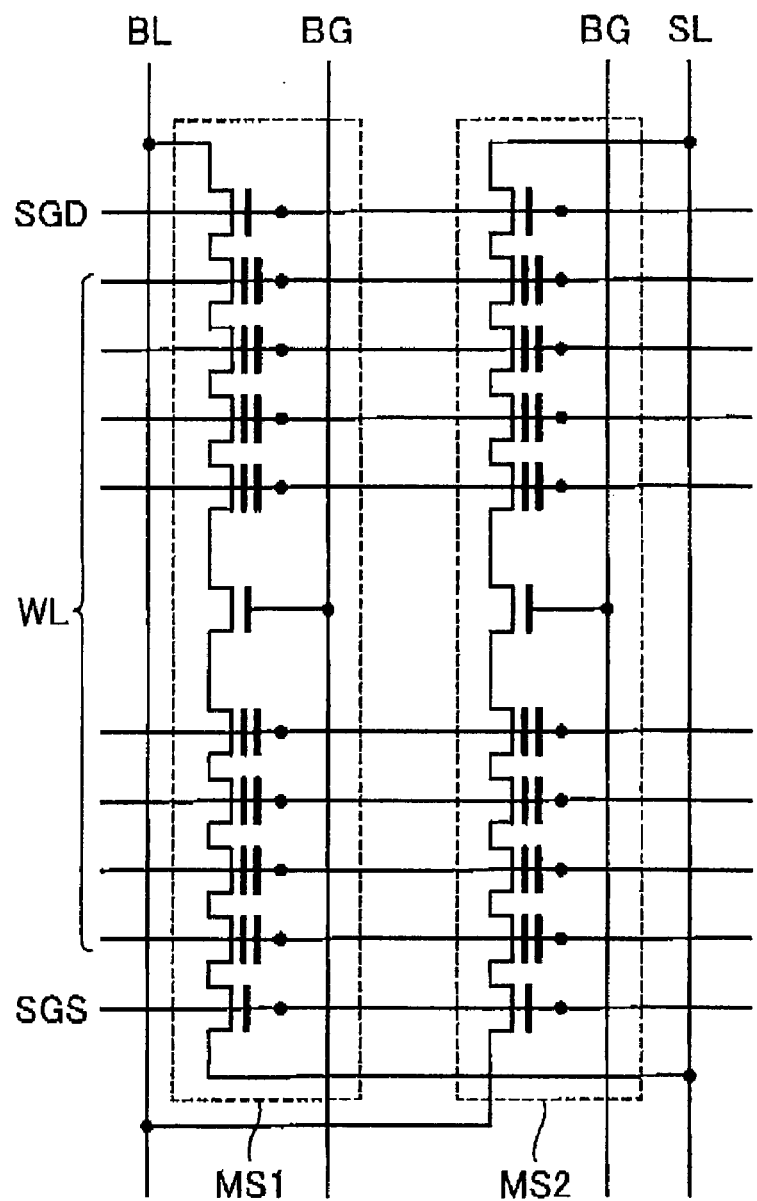
FIG. 14 is an equivalent circuit diagram of the memory cell array 12' according to the third embodiment.
Figure 15:
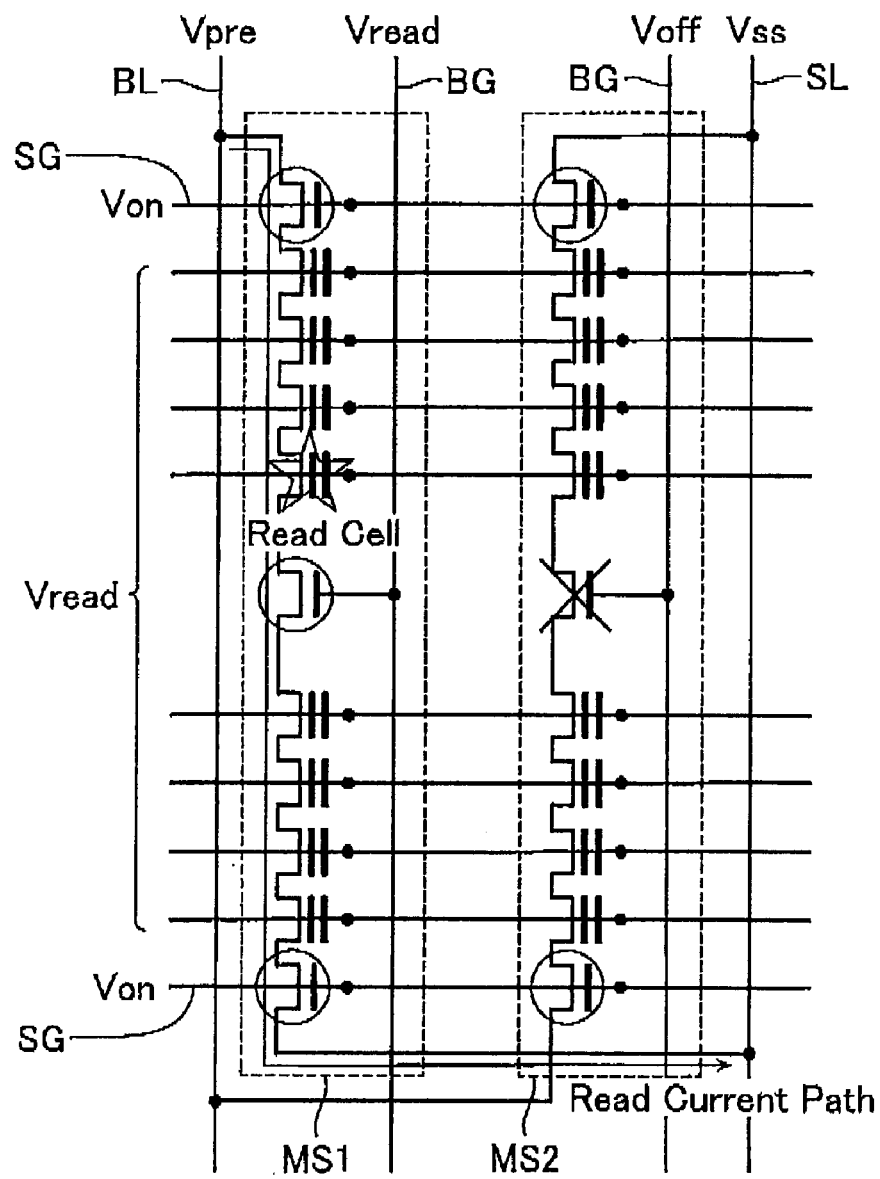
FIG. 15 is a circuit diagram illustrating a read operation of the semiconductor storage device of the third embodiment.

In addition, the configuration to achieve an equivalent circuit as illustrated in FIGS. 7 and 14 is not specifically limited to the semiconductor storage device having a three-dimensional structure as illustrated in FIG. 2 and so on. It may be achieved by other semiconductor storage devices where memory cells are arranged in a two-dimensional manner on the substrate.

For example, the circuit as illustrated in the equivalent circuit of FIG. 7 may be achieved by a two-dimensional memory cell array where a plurality of memory strings MS are connected in parallel between a pair of a bit line BL and a source line SL, and where some (e.g., four) of a plurality of (e.g., eight) memory transistors MTr in each of two adjacent memory strings MS1 and MS2 share word lines WL with each other and the remaining memory transistors share word lines WL with another memory string. Note that for the two-dimensional structure, the back-gate transistors BGTr may be omitted.

In addition, the configuration as illustrated in the equivalent circuit of FIG. 14 may also be achieved by a two-dimensional memory cell array where a plurality of memory strings MS are connected in parallel between a pair of a bit line BL and a source line SL, and where all of a plurality of (e.g., eight) memory transistors MTr in each of two adjacent memory strings MS1 and MS2 share word lines WL with each other and only back-gate transistors BGTr are independently controlled. This means that at least one of the transistors included in adjacent memory strings needs only to be controlled independently.

In addition, while the above embodiments have been described in the context of adjacent memory strings MS being included in the equivalent circuits as illustrated in FIGS. 4, 14, and 18, the present invention is not so limited. For example, other configurations may fall within the scope of the invention, such as where proximately located memory strings are connected in a relation as illustrated in FIGS. 4, 14, and 18 with another memory string sandwiched therebetween.

What is claimed is:
1. A semiconductor storage device comprising:
    a memory cell array having a plurality of memory strings arranged therein, each of the memory strings including a plurality of electrically rewritable memory transistors, selection transistors operative to select a memory transistor, and a back-gate transistor,
    each of the plurality of memory strings comprising:
        a body semiconductor layer having a columnar portion extending in a vertical direction to a substrate;
        an electric charge storage layer formed to surround a side surface of the columnar portion;
        a first conductive layer formed to surround a side surface of the columnar portion as well as the electric charge storage layer, and functioning as a word line connected to a control electrode of the memory transistor;
        a second conductive layer formed on a side surface of the columnar portion via an insulation film, and functioning as a selection gate line connected to a control electrode of a respective one of the selection transistors;

a third conductive layer arranged with a first direction taken as its longitudinal direction, connected to one end of a respective one of the memory strings, and functioning as a bit line;

a fourth conductive layer arranged with the first direction taken as its longitudinal direction, connected to the other end of a respective one of the memory strings, and functioning as a source line; and a fifth conductive layer arranged with the first direction taken as its longitudinal direction, connected to a control gate of the back-gate transistor and functioning as a control electrode of the back-gate transistor;

wherein the memory transistors included in a first memory string as one of the memory strings connected to a pair of the third conductive layer and the fourth conductive layer are commonly connected to the first conductive layers connected to the memory transistors included in a second memory string as one of the memory strings, the second memory string being connected to the same pair of the third conductive layer and the fourth conductive layer as that of the first memory string, and adjacent to the first memory string, and the back-gate transistor in the first memory string and the back-gate transistor in the second memory string are each connected to independent of the fifth conductive layers.

2. The semiconductor storage device according to claim 1, wherein
the fifth conductive layer has a wider wiring width than the third and fourth conductive layers.

3. The semiconductor storage device according to claim 2, wherein
under the fourth conductive layer, two of the memory strings are arranged along a second direction perpendicular to the first direction.

4. The semiconductor storage device according to claim 1, further comprising a sixth conductive layer below the third or fourth conductive layer, the sixth conductive layer being connected to an upper end of the first or second columnar portion and the third or fourth conductive layer via a contact.

5. The semiconductor storage device according to claim 4, wherein the sixth conductive layer is arranged with a second direction orthogonal to the first direction taken as its longitudinal direction.

6. The semiconductor storage device according to claim 1, wherein
the body semiconductor layer includes a first columnar portion extending in an perpendicular direction with respect to the substrate and having one end connected to the bit line via a drain-side selection transistor, a second columnar portion extending in an perpendicular direction with respect to the substrate and having one end connected to the source line via a source-side selection transistor, and a joining portion formed to connect lower ends of the first and second columnar portions, the memory transistors located in the first columnar portion of the first memory string are connected, via the first conductive layers, to the memory transistors located in the second columnar portion in the second memory string, the second memory string being adjacent to the first memory string, and the memory transistors located in the second columnar portion of the first memory string are connected, via the first conductive layers, to the memory transistors located in the first columnar portion in the second memory string.

7. The semiconductor storage device according to claim 6, wherein
the fifth conductive layer has a wider wiring width than the third and fourth conductive layers.

8. The semiconductor storage device according to claim 7, wherein
under the fourth conductive layer, two of the memory strings are arranged along a second direction perpendicular to the first direction.

9. The semiconductor storage device according to claim 6, wherein the joining portion is arranged with the first direction taken as its longitudinal direction.

* * * * *